United States Patent
Okita et al.

(10) Patent No.: US 11,781,246 B2
(45) Date of Patent: *Oct. 10, 2023

(54) SILICON CARBIDE SINGLE CRYSTAL SUBSTRATE

(71) Applicant: Sumitomo Electric Industries, Ltd., Osaka (JP)

(72) Inventors: Kyoko Okita, Itami (JP); Takashi Sakurada, Itami (JP); Eiryo Takasuka, Itami (JP); Shunsaku Ueta, Itami (JP); Sho Sasaki, Itami (JP); Naoki Kaji, Itami (JP); Hidehiko Mishima, Osaka (JP); Hirokazu Eguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,200

(22) Filed: Nov. 23, 2022

(65) Prior Publication Data

US 2023/0081506 A1    Mar. 16, 2023

Related U.S. Application Data

(63) Continuation of application No. 16/074,143, filed as application No. PCT/JP2017/003139 on Jan. 30, 2017, now Pat. No. 11,535,953.

(30) Foreign Application Priority Data

Feb. 9, 2016   (JP) .................................. 2016-022388

(51) Int. Cl.
*C30B 29/36*    (2006.01)
*G01N 23/207*    (2018.01)
(Continued)

(52) U.S. Cl.
CPC ........... *C30B 29/36* (2013.01); *G01N 23/207* (2013.01); *C01B 32/956* (2017.08); *C01P 2002/72* (2013.01); *C30B 29/64* (2013.01)

(58) Field of Classification Search
CPC ....... C30B 29/36; C30B 29/64; G01N 23/207; C01B 32/956; C01P 2002/72
See application file for complete search history.

(56) References Cited

U.S. PATENT DOCUMENTS 11,535,953 B2 *   12/2022   Okita ................... G01N 23/207
2003/0070611 A1    4/2003   Nakamura et al.
(Continued)

FOREIGN PATENT DOCUMENTS

CN     103476975 A    12/2013
JP    2008-535761 A     9/2008
(Continued)

*Primary Examiner* — Robert M Kunemund
(74) *Attorney, Agent, or Firm* — Faegre Drinker Biddle & Reath LLP

(57) ABSTRACT

In a case where a detector is positioned in a [11-20] direction, and where a first measurement region including a center of a main surface is irradiated with an X ray in a direction within ±15° relative to a [−1-120] direction, a ratio of a maximum intensity of a first intensity profile is more than or equal to 1500. In a case where the detector is positioned in a direction parallel to a [−1100] direction, and where the first measurement region is irradiated with an X ray in a direction within ±6° relative to a [1-100] direction, a ratio of a maximum intensity of a second intensity profile is more than or equal to 1500. An absolute value of a difference between maximum value and minimum value of energy at which the first intensity profile indicates a maximum value is less than or equal to 0.06 keV.

7 Claims, 16 Drawing Sheets

(51) Int. Cl.
*C30B 29/64* (2006.01)
*C01B 32/956* (2017.01)

(56) References Cited

U.S. PATENT DOCUMENTS

| | | |
|---|---|---|
| 2010/0080956 A1 | 4/2010 | Fujimoto et al. |
| 2012/0132132 A1 | 5/2012 | Urakami et al. |
| 2012/0294790 A1 | 11/2012 | Sasaki et al. |
| 2014/0363607 A1 | 12/2014 | Sato et al. |
| 2019/0376206 A1 | 12/2019 | Fukada et al. |

FOREIGN PATENT DOCUMENTS

| | | |
|---|---|---|
| JP | 2008-290898 A | 12/2008 |
| JP | 2009-120419 A | 6/2009 |
| JP | 2014-169944 A | 9/2014 |
| WO | WO 2006/108191 A2 | 10/2006 |

\* cited by examiner

SILICON CARBIDE SINGLE CRYSTAL SUBSTRATE

TECHNICAL FIELD

The present disclosure relates to a silicon carbide single crystal substrate. The present application is a continuation of U.S. patent application Ser. No. 16/074,143 filed on Jul. 31, 2018, now U.S. Pat. No. 11,535,953, which is a National Stage Entry of PCT/JP2017/003139 filed on Jan. 30, 2017, which claims a priority based on Japanese Patent Application No. 2016-022388 filed on Feb. 9, 2016, the entire content of which are incorporated herein by reference.

BACKGROUND ART

For example, Japanese Patent Laying-Open No. 2009-120419 (Patent Document 1) describes a method for manufacturing a silicon carbide single crystal using a sublimation method.

CITATION LIST

Patent Document

PTD 1: Japanese Patent Laying-Open No. 2009-120419

SUMMARY OF INVENTION

A silicon carbide single crystal substrate according to the present disclosure includes a main surface inclined in a <11-20> direction relative to a (0001) plane. In a case where a detector is positioned in a [11-20] direction when viewed in a direction perpendicular to the main surface, where a first measurement region including a center of the main surface is irradiated with an X ray in a direction within ±15° relative to a [-1-120] direction, and where a diffracted X ray from the first measurement region is measured using the detector, a ratio of a maximum intensity of a first intensity profile of the diffracted X ray in a range of 6.9 keV to 11.7 keV to a background intensity of the first intensity profile is more than or equal to 1500. In a case where the detector is positioned in a direction parallel to a [-1100] direction when viewed in the direction perpendicular to the main surface, where the first measurement region is irradiated with an X ray in a direction within ±6° relative to a [1-100] direction, and where a diffracted X ray from the first measurement region is measured using the detector, a ratio of a maximum intensity of a second intensity profile of the diffracted X ray in a range of 8.0 keV to 9.5 keV to a background intensity of the second intensity profile is more than or equal to 1500. In a case where the detector is positioned in the [11-20] direction when viewed in the direction perpendicular to the main surface and a location to be irradiated with the X ray is changed in a range of ±15° relative to the [-1-120] direction, an absolute value of a difference between maximum value and minimum value of energy at which the first intensity profile indicates a maximum value in the range of 6.9 keV to 11.7 keV is less than or equal to 0.06 keV.

DESCRIPTION OF EMBODIMENTS

Figure 1:
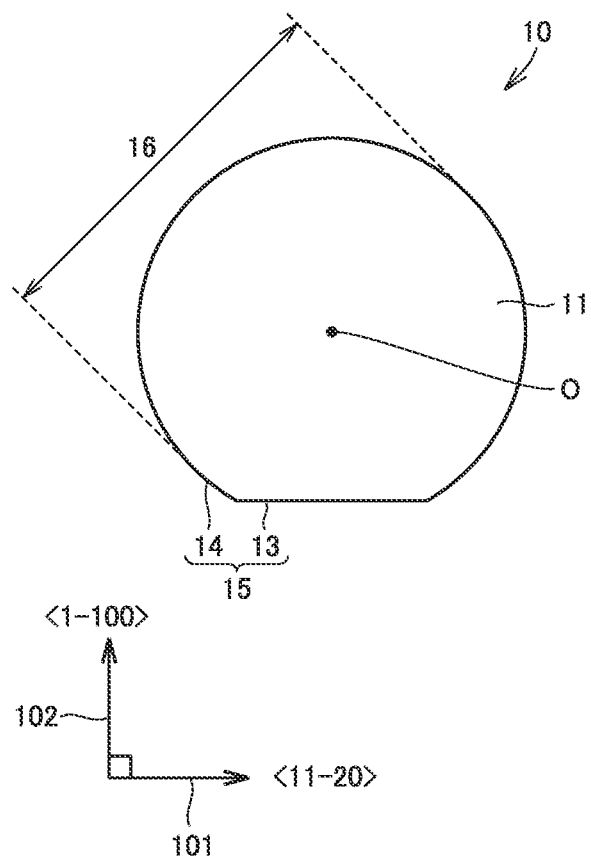
FIG. 1 is a schematic plan view showing a configuration of a silicon carbide single crystal substrate according to the present embodiment.

Problem to be Solved by the Present Disclosure

An object of the present disclosure is to provide a silicon carbide single crystal substrate with reduced strain.

Advantageous Effect of the Present Disclosure

According to the present disclosure, a silicon carbide single crystal substrate with reduced strain can be provided.

Summary of Embodiment of the Present Disclosure

First, the following describes a summary of an embodiment of the present disclosure. Regarding crystallographic indications in the present specification, an individual orientation is represented by [ ], a group orientation is represented by < >, and an individual plane is represented by ( ), and a group plane is represented by { }. A negative index is supposed to be crystallographically indicated by putting "-"

(bar) above a numeral, but is indicated by putting the negative sign before the numeral in the present specification.

(1) A silicon carbide single crystal substrate according to the present disclosure includes a main surface 11 inclined in a <11-20> direction relative to a (0001) plane. In a case where a detector 6 is positioned in a [11-20] direction when viewed in a direction perpendicular to main surface 11, where a first measurement region 31 including a center of main surface 11 is irradiated with an X ray in a direction within ±15° relative to a [-1-120] direction, and where a diffracted X ray from first measurement region 31 is measured using detector 6, a ratio of a maximum intensity of a first intensity profile 1 of the diffracted X ray in a range of 6.9 keV to 11.7 keV to a background intensity of first intensity profile 1 is more than or equal to 1500. In a case where detector 6 is positioned in a direction parallel to a [-1100] direction when viewed in the direction perpendicular to main surface 11, where first measurement region 31 is irradiated with an X ray in a direction within ±6° relative to a [1-100] direction, and where a diffracted X ray from first measurement region 31 is measured using detector 6, a ratio of a maximum intensity of a second intensity profile 2 of the diffracted X ray in a range of 8.0 keV to 9.5 keV to a background intensity of second intensity profile 2 is more than or equal to 1500. In a case where detector 6 is positioned in the [11-20] direction when viewed in the direction perpendicular to main surface 11 and a location to be irradiated with the X ray is changed in a range of ±15° relative to the [-1-120] direction, an absolute value of a difference between maximum value EH1 and minimum value EL1 of energy at which first intensity profile 1 indicates a maximum value in the range of 6.9 keV to 11.7 keV is less than or equal to 0.06 keV.

Normally, a silicon carbide single crystal substrate is obtained by slicing a silicon carbide single crystal ingot such that the silicon carbide single crystal substrate has a main surface corresponding to a desired plane (for example, a plane inclined by 4° relative to the (0001) plane). In a detailed analysis of a crystal lattice arrangement of an actual silicon carbide single crystal substrate, the crystal lattice is aligned to form a desired plane in the main surface of the silicon carbide single crystal substrate; however, in a high index crystal plane, the crystal lattice may not be aligned to form a theoretical lattice plane of a hexagonal silicon carbide. Specifically, for example, in the case of an ideal hexagonal silicon carbide, silicon atoms or carbon atoms are arranged in a specific high index crystal plane indicated by a below-described crystal plane (1). However, in the case of an actual hexagonal silicon carbide, silicon atoms or carbon atoms may not be arranged in the above-described specific high index crystal plane, and may be arranged in a plane inclined relative to the above-described specific high index crystal plane. This is presumably due to the following reason: the crystal lattice arrangement inside the silicon carbide single crystal substrate is three-dimensionally strained and is therefore deviated from the theoretical crystal lattice arrangement of the hexagonal silicon carbide. It should be noted that the high index crystal plane refers to a (1-10X) plane (where X=3, 5, 7, 10, or the like), for example.

$$(1 \; -1 \; 0 \; 10) \ldots \text{crystal plane (1)} \quad \text{[Formula 1]}$$

In order to obtain a high-quality silicon carbide single crystal substrate with small three-dimensional strain, it is desirable that growth of a silicon carbide single crystal ingot proceeds with a small change in thermal environment of the crystal surface in the process of growing the silicon carbide single crystal ingot, while maintaining a growth surface thereof as flat as possible. In order to realize such a crystal growth environment, for example, it is considered to: use a silicon carbide single crystal manufacturing apparatus having heaters with a 5-zone structure; and individually control respective heater powers of the heaters to reduce a temperature distribution of the growth surface of the silicon carbide single crystal ingot and to reduce a temperature change of the growth surface. Specifically, for example, in a range in which the length of the silicon carbide single crystal ingot is 0 to 25 mm, a thermal fluid simulation is performed for every 1 mm, thereby calculating temperature distributions in the growth surface of the ingot and in the source material and calculating a temperature distribution around a crucible. Then, respective heater powers to be applied to the heaters are determined to reduce the temperature distributions in the growth surface of the silicon carbide single crystal ingot and in the source material and to reduce temperature changes of the growth surface and source material surface. The thermal fluid simulation is to calculate a temperature distribution in a furnace using heat conductivities and emissivities of members, such as the crucible and a heat insulator, a seed crystal, and a silicon carbide source material, for example. By controlling the respective heater powers of the heaters based on the result of the thermal fluid simulation as described below, a silicon carbide single crystal ingot with small strain can be obtained. As a result, a silicon carbide single crystal substrate with reduced strain can be obtained.

(2) In silicon carbide single crystal substrate 10 according to (1), in a case where detector 6 is positioned in the direction parallel to the [-1100] direction when viewed in the direction perpendicular to main surface 11 and the location to be irradiated with the X ray is changed in a range of ±6° relative to the [1-100] direction, an absolute value of a difference between maximum value EH2 and minimum value EL2 of energy at which second intensity profile 2 indicates a maximum value in the range of 8.0 keV to 9.5 keV may be less than or equal to 0.08 keV.

(3) In silicon carbide single crystal substrate 10 according to (1) or (2), main surface 11 may have a maximum diameter of more than or equal to 100 mm. In a case where detector 6 is positioned in the [11-20] direction when viewed in the direction perpendicular to main surface 11, where a second measurement region 32 including a location distant away by 10 mm from an outer edge of main surface 11 is irradiated with an X ray in the direction within ±15° relative to the [-1-120] direction, and where a diffracted X ray from second measurement region 32 is measured using detector 6, a ratio of a maximum intensity of a third intensity profile 3 of the diffracted X ray in the range of 6.9 keV to 11.7 keV to a background intensity of third intensity profile 3 may be more than or equal to 1500. In a case where detector 6 is positioned in the [-1100] direction when viewed in the direction perpendicular to main surface 11, where second measurement region 32 is irradiated with an X ray in the direction within ±6° relative to the [1-100] direction, and where a diffracted X ray from second measurement region 32 is measured using detector 6, a ratio of a maximum intensity of a fourth intensity profile 4 of the diffracted X ray in the range of 8.0 keV to 9.5 keV to a background intensity of fourth intensity profile 4 may be more than or equal to 1500. In a case where detector 6 is positioned in the [11-20] direction when viewed in the direction perpendicular to main surface 11 and the location to be irradiated with the X ray is changed in the range of ±15° relative to the [-1-120] direction, an absolute value of a difference between maximum value and minimum value of energy at which third intensity profile 3 indicates a maximum value in the range of 6.9 keV to 11.7 keV may be less than or equal to 0.06 keV.

In the case of manufacturing silicon carbide single crystal substrate 10 having main surface 11 with a maximum diameter of more than or equal to 100 mm, it is more difficult to reduce the temperature distribution of the growth surface of the silicon carbide single crystal ingot and reduce the temperature change of the growth surface than those in the case where the maximum diameter of main surface 11 is less than 100 mm. According to a below-described method, strain can be reduced also in such a silicon carbide single crystal substrate having main surface 11 with a maximum diameter of more than or equal to 100 mm.

(4) In silicon carbide single crystal substrate 10 according to (3), in a case where detector 6 is positioned in the direction parallel to the [−1100] direction when viewed in the direction perpendicular to main surface 11 and the location to be irradiated with the X ray is changed in the range of ±6° relative to the [1-100] direction, an absolute value of a difference between maximum value and minimum value of energy at which fourth intensity profile 4 indicates a maximum value in the range of 8.0 keV to 9.5 keV may be less than or equal to 0.08 keV.

Details of Embodiment of the Present Disclosure

The following describes details of the embodiment of the present disclosure with reference to figures. First, a configuration of a silicon carbide single crystal substrate 10 according to the embodiment will be described. It should be noted that in the below-described figures, the same or corresponding portions are given the same reference characters and are not described repeatedly.

Figure 2:
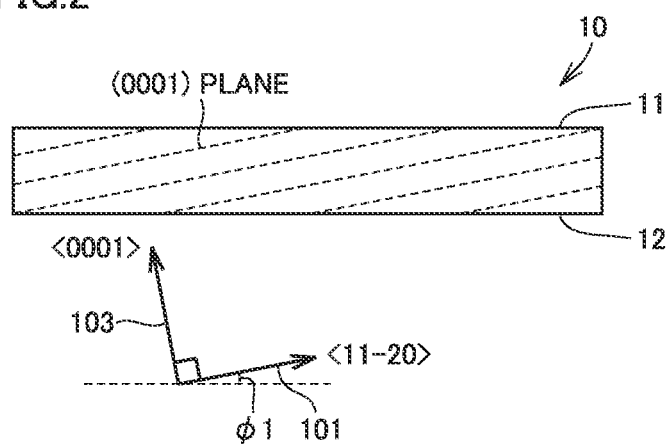
FIG. 2 is a schematic cross sectional view showing the configuration of the silicon carbide single crystal substrate according to the present embodiment.

As shown in FIG. 1 and FIG. 2, silicon carbide single crystal substrate 10 according to the present embodiment mainly includes: a first main surface 11; a second main surface 12 opposite to first main surface 11; and an outer edge 15. Outer edge 15 of silicon carbide single crystal substrate 10 has a first flat 13 and a curvature portion 14, for example. First flat 13 extends along a first direction 101, for example. Outer edge 15 may have a second flat (not shown). The second flat extends along a second direction 102 perpendicular to first direction 101, for example. First direction 101 is a <11-20> direction, for example. Second direction 102 is a <1-100> direction, for example.

First main surface 11 corresponds to a plane inclined in an off direction relative to a (0001) plane. First main surface 11 corresponds to a plane inclined by more than or equal to 0.5° and less than or equal to 8° relative to the (0001) plane, for example. The off direction is the <11-20> direction, for example. For example, the off direction may be a direction inclined by an angle of ±5° relative to the <11-20> direction in the (0001) plane. An off angle $\phi1$ (see FIG. 2) may be more than or equal to 1° or may be more than or equal to 2°. Off angle $\phi1$ may be less than or equal to 7° or may be less than or equal to 6°.

Silicon carbide single crystal substrate 10 is constituted of a silicon carbide single crystal. The silicon carbide single crystal has a polytype of 4H—SiC, for example. 4H—SiC is superior to other polytypes in terms of electron mobility, dielectric strength, and the like. Silicon carbide single crystal substrate 10 includes an n type impurity such as nitrogen, for example. The conductivity type of silicon carbide single crystal substrate 10 is n type, for example.

As shown in FIG. 1, first main surface 11 has a maximum diameter 16 (diameter) of more than or equal to 100 mm. Maximum diameter 16 may be more than or equal to 150 mm, may be more than or equal to 200 mm, or may be more than or equal to 250 mm. The upper limit of maximum diameter 16 is not limited in particular. The upper limit of maximum diameter 16 may be 300 mm, for example.

Next, the following describes a method for evaluating a three-dimensional strain of silicon carbide single crystal substrate 10.

Figure 3:
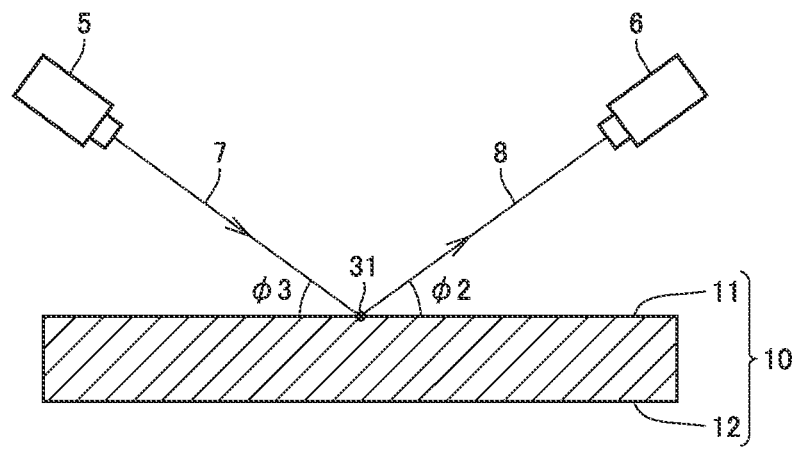
FIG. 3 is a schematic front view showing a method for measuring a first intensity profile.

The three-dimensional strain of silicon carbide single crystal substrate 10 can be evaluated quantitatively by using an energy dispersion type X-ray diffractometer (model number: D2 CRYSO) provided by Bruker, for example. As shown in FIG. 3, an X ray emitter 5 and a detector 6 are positioned to face first main surface 11. X ray emitter 5 is configured to emit an X ray to first main surface 11. X ray emitter 5 includes an X ray tube (rhodium), for example. X ray emitter 5 is configured to emit a white X ray, for example. Detector 6 is configured to detect a diffracted X ray from first main surface 11. Detector 6 is an energy dispersion type detector, for example.

First, the following describes a method for measuring a (0008) plane parallel to the (0001) plane.

Figure 4:
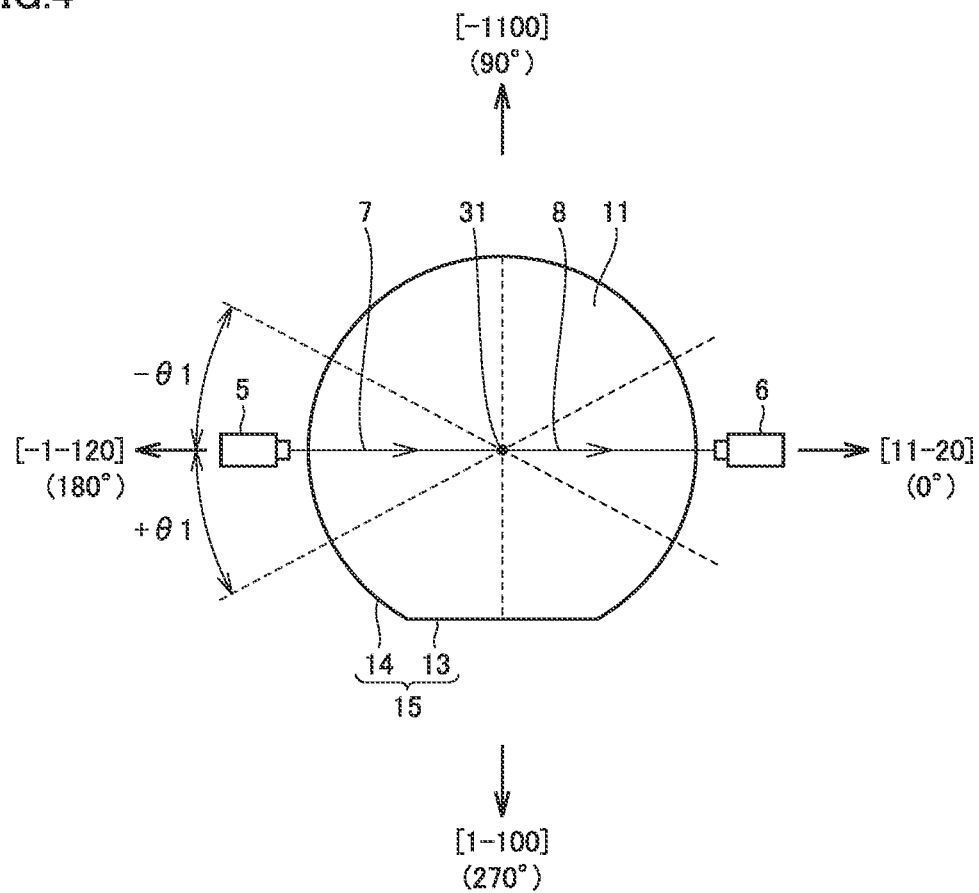
FIG. 4 is a schematic plan view showing the method for measuring the first intensity profile.

As shown in FIG. 4, when viewed from a first measurement region 31 including center O of first main surface 11, X ray emitter 5 is positioned in a [−1-120] direction. It is assumed that the [11-20] direction, [−1100] direction, [−1-120] direction and [1-100] direction respectively correspond to 0°, 90°, 180° and 270° when viewed in the direction perpendicular to first main surface 11. When viewed in the direction perpendicular to first main surface 11, X ray emitter 5 is positioned at a location of 180°. An incoming X ray 7 is emitted from X ray emitter 5 to first measurement region 31. When viewed from first measurement region 31 including center O of first main surface 11, detector 6 is positioned in the [11-20] direction. In other words, when viewed in the direction perpendicular to first main surface 11, detector 6 is positioned at a location of 0°. A diffracted X ray 8 diffracted by first measurement region 31 is measured by detector 6.

In the case where first main surface 11 corresponds to a plane angled off by 4° in the <11-20> direction relative to the (0001) plane, an elevation angle $\phi3$ of X ray emitter 5 relative to first main surface 11 (in other words, angle $\phi3$ between incoming X ray 7 and first main surface 11: see FIG. 3) is 29.889°, for example. An elevation angle $\phi2$ of detector 6 relative to first main surface 11 (in other words, angle $\phi2$ between diffracted X ray 8 and first main surface 11: see FIG. 3) is 67.765°, for example.

In the case where first main surface 11 corresponds to a plane angled off by 8° in the <11-20> direction relative to the (0001) plane, elevation angle $\phi3$ of X ray emitter 5 relative to first main surface 11 (in other words, angle $\phi3$ between incoming X ray 7 and first main surface 11: see FIG. 3) is 29.91°, for example. Elevation angle $\phi2$ of detector 6 relative to first main surface 11 (in other words, angle $\phi2$ between diffracted X ray 8 and first main surface 11: see FIG. 3) is 75.756°, for example.

Figure 5:
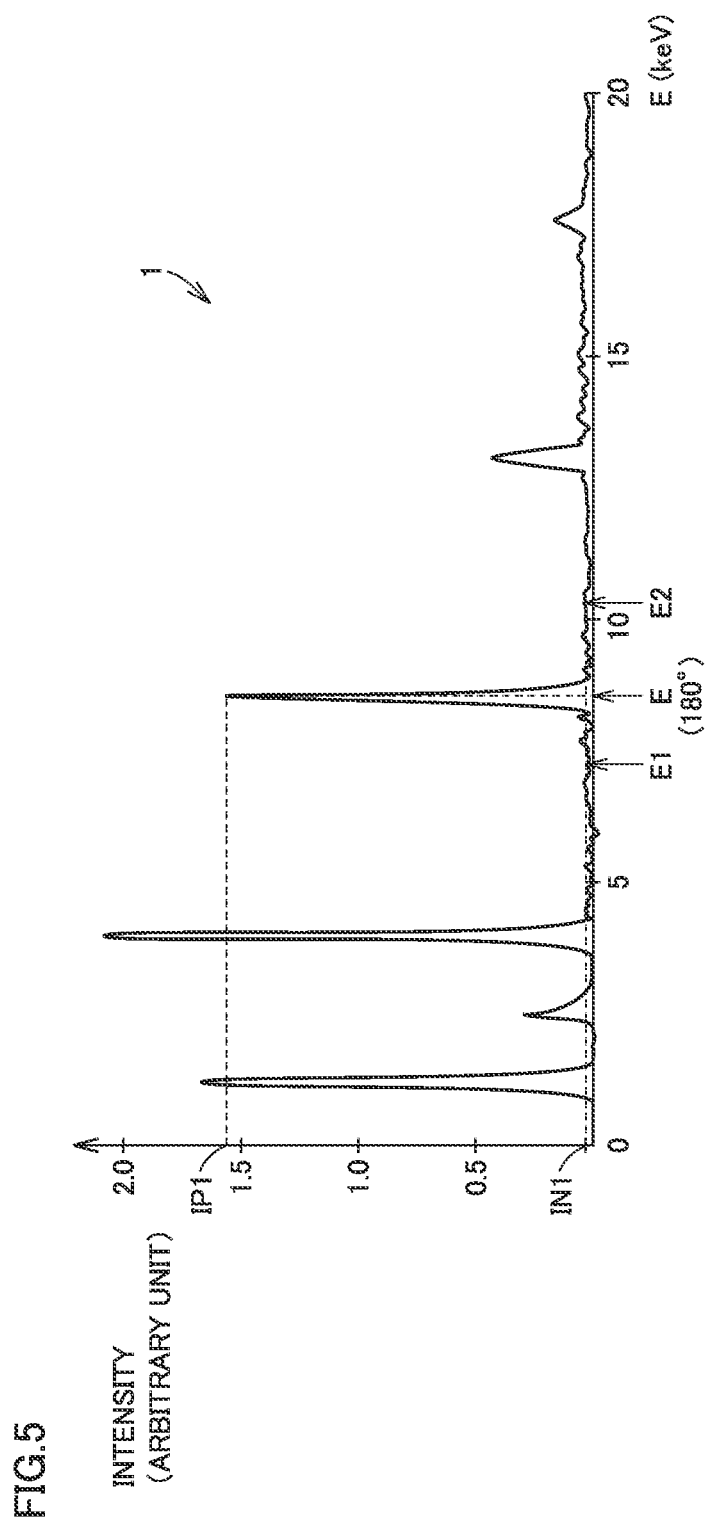
FIG. 5 shows an exemplary first intensity profile.

FIG. 5 shows an exemplary intensity profile (first intensity profile) of the diffracted X ray measured with X ray emitter 5 and detector 6 being positioned as shown in FIG. 4. The horizontal axis represents energy of the diffracted X ray. The vertical axis represents intensity of the diffracted X ray. As shown in FIG. 5, first intensity profile 1 has a maximum value at energy between first energy E1 and second energy E2. First energy E1 is 6.9 keV, for example. Second energy E2 is 11.7 keV, for example. First energy E1 may be 7.7 keV. Second energy E2 may be 10.4 keV. The maximum value of first intensity profile 1 in the region between first energy E1 and second energy E2 results from the (0008) plane. When the off angle of first main surface 11 is changed, the energy at which the maximum value of the intensity profile is indicated is changed. For example, in the case where first main surface 11 corresponds to a plane angled off by 4° in the <11-20> direction relative to the (0001) plane, energy corresponding to the (0008) plane is 8.84 keV, whereas in the case where first main surface 11 corresponds to a plane angled off by 8° in the <11-20> direction relative to the (0001) plane, energy corresponding to the (0008) plane is 8.03 keV.

Based on first intensity profile 1, an intensity IP1 of the maximum value of the intensity profile in the region between first energy E1 and second energy E2, and a background intensity IN1 thereof are measured. Background intensity IN1 is an intensity of the intensity profile at second energy E2, for example. Similarly, between first energy E1 and second energy E2, energy E(180°) at which first intensity profile 1 indicates the maximum value is measured. It should be noted that as shown in FIG. 5, the intensity (about 1.6) of the maximum value of first intensity profile 1 in the region between first energy E1 and second energy E2 may be different from the intensity (about 2.1) of the maximum value of first intensity profile 1 in the entire measurement range.

Figure 6:
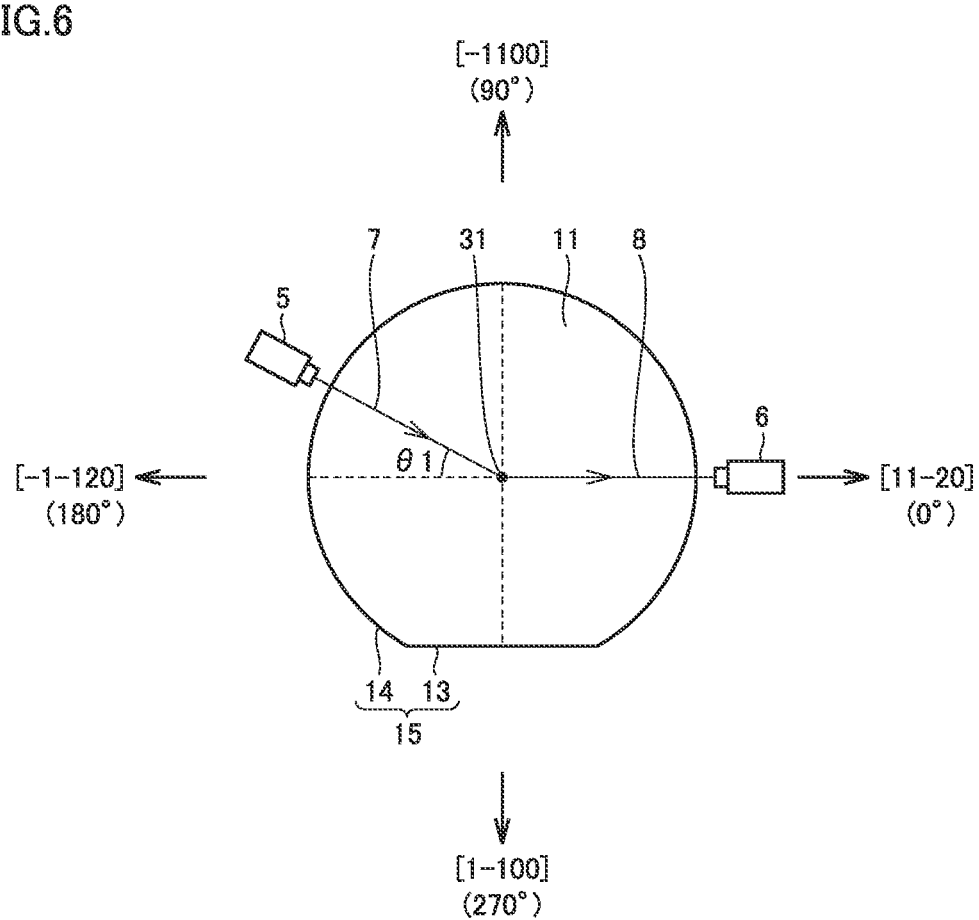
FIG. 6 is a schematic plan view showing the method for measuring the first intensity profile.

Next, the location of X ray emitter 5 is changed in a plane parallel to first main surface 11. As shown in FIG. 6, when viewed in the direction perpendicular to first main surface 11, X ray emitter 5 is positioned at a location of (180−θ1)°. Angle θ1 is 15°, for example. That is, when viewed in the direction perpendicular to first main surface 11, X ray emitter 5 is positioned at a location of 165°. Elevation angle φ3 (see FIG. 3) of X ray emitter 5 relative to first main surface 11 is the same as that in the case where X ray emitter 5 is positioned at the location of 180°. Detector 6 is positioned in the same manner as that in the case where X ray emitter 5 is positioned at the location of 180°. With the positioning above, first measurement region 31 is irradiated with incoming X ray 7 from X ray emitter 5 and diffracted X ray 8 diffracted by first measurement region 31 is measured by detector 6.

Accordingly, the first intensity profile of the diffracted X ray in the case where X ray emitter 5 is positioned at the location of 165° is obtained. Based on the first intensity profile, intensity IP1 of the maximum value of the first intensity profile in the region between first energy E1 and second energy E2 and background intensity IN1 thereof are measured. Similarly, energy E(165°) at which first intensity profile 1 indicates the maximum value is measured.

Figure 7:
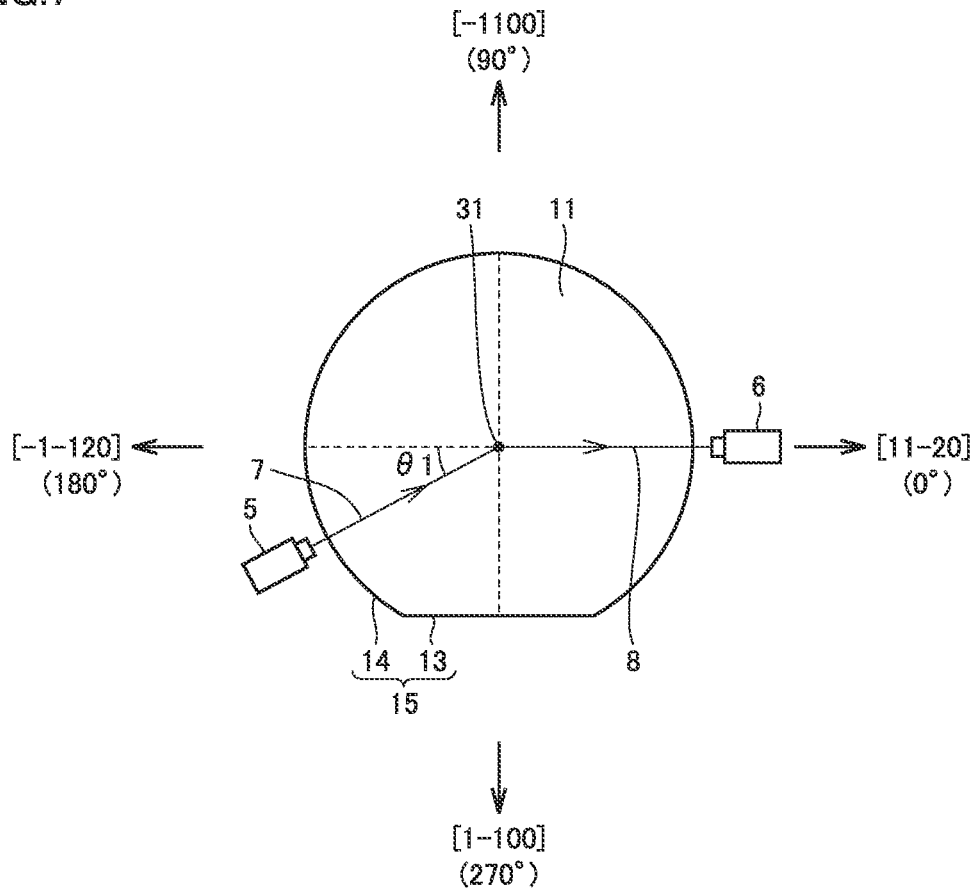
FIG. 7 is a schematic plan view showing the method for measuring the first intensity profile.

Next, the location of X ray emitter 5 is changed in the plane parallel to first main surface 11. As shown in FIG. 7, when viewed in the direction perpendicular to first main surface 11, X ray emitter 5 is positioned at a location of (180+θ1)°. Angle θ1 is 15°, for example. That is, when viewed in the direction perpendicular to first main surface 11, X ray emitter 5 is positioned at a location of 195°. Elevation angle φ3 (see FIG. 3) of X ray emitter 5 relative to first main surface 11 is the same as that in the case where X ray emitter 5 is positioned at the location of 180°. Detector 6 is positioned in the same manner as that in the case where X ray emitter 5 is positioned at the location of 180°. With the positioning above, first measurement region 31 is irradiated with incoming X ray 7 from X ray emitter 5 and diffracted X ray 8 diffracted by first measurement region 31 is measured by detector 6.

Accordingly, the first intensity profile of the diffracted X ray in the case where X ray emitter 5 is positioned at the location of 195° is obtained. Based on the first intensity profile, intensity IP1 of the maximum value of the first intensity profile in the region between first energy E1 and second energy E2 and background intensity IN1 thereof are measured. Similarly, energy E(195°) at which first intensity profile 1 indicates the maximum value is measured.

Figure 8:
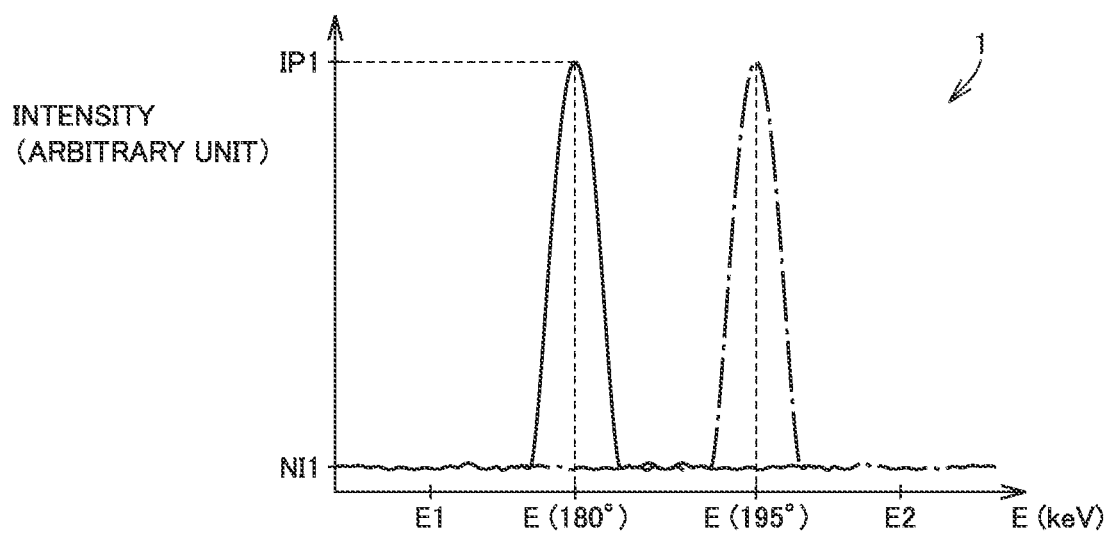
FIG. 8 shows an exemplary first intensity profile.

As shown in FIG. 8, energy E(195°) at which first intensity profile 1 indicates the maximum value in the case where X ray emitter 5 is positioned at the location of 195° may be different from energy E(180°) at which first intensity profile 1 indicates the maximum value in the case where X ray emitter 5 is positioned at the location of 180°. For example, when an arrangement of the crystal lattice of the silicon carbide when viewed in the direction of 195° is different from an arrangement of the crystal lattice of the silicon carbide when viewed in the direction of 180°, energy E(195°) at which first intensity profile 1 indicates the maximum value is different from energy E(180°) at which first intensity profile 1 indicates the maximum value. In other words, as the three-dimensional strain of the silicon carbide single crystal is smaller, a difference is smaller between energy E(195°) at which first intensity profile 1 indicates the maximum value and energy E(180°) at which first intensity profile 1 indicates the maximum value.

As described above, by changing the location of X ray emitter 5 at an interval of 5° in the range of 180°±15°, seven first intensity profiles are measured. Based on each of the seven first intensity profiles, intensity IP1 of the maximum value of the first intensity profile in the region between first energy E1 and second energy E2 and background intensity IN1 thereof are measured. In each of all the first intensity profiles, a ratio (i.e., IP1/IN1) of the maximum intensity of first intensity profile 1 in the range of 6.9 keV to 11.7 keV to the background intensity of first intensity profile 1 is more than or equal to 1500, is preferably more than or equal to 2000, and is more preferably more than or equal to 2500.

In other words, in the case where detector 6 is positioned in the [11-20] direction when viewed in the direction perpendicular to main surface 11, where first measurement region 31 including center O of main surface 11 is irradiated with an X ray in the direction within ±15° relative to the [−1-120] direction, and where a diffracted X ray from first measurement region 31 is measured using detector 6, the ratio of the maximum intensity of first intensity profile 1 of the diffracted X ray in the range of 6.9 keV to 11.7 keV to the background intensity of first intensity profile 1 is more than or equal to 1500.

Figure 9:
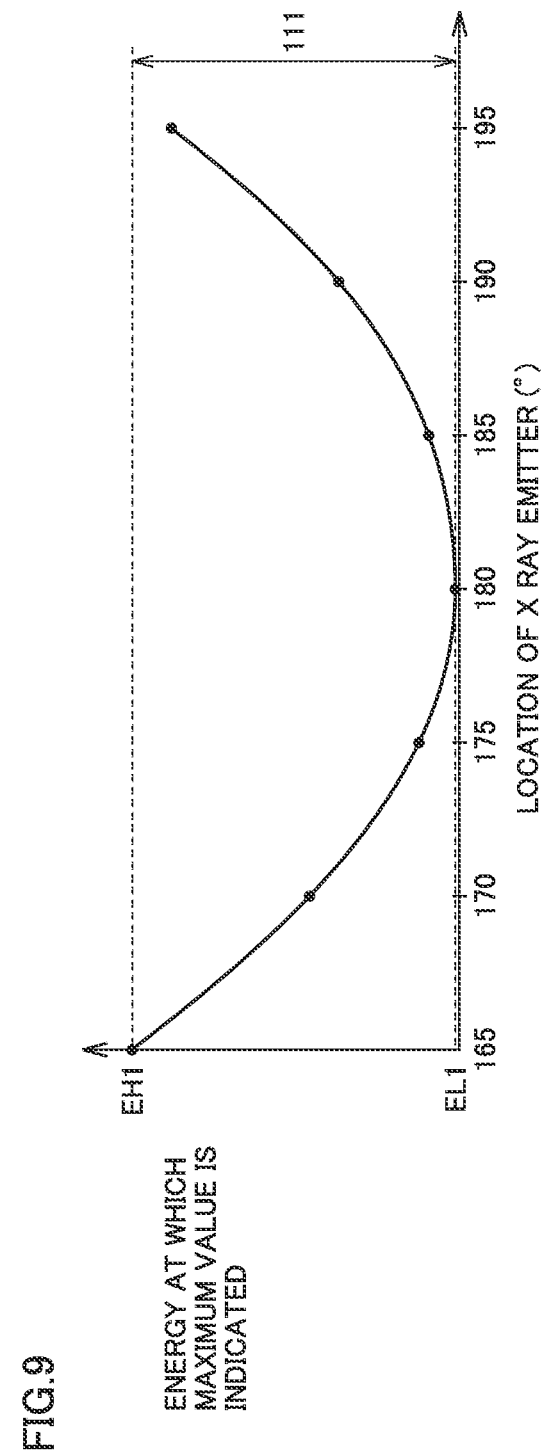
FIG. 9 shows a relation between an angle of a detector and energy at which the maximum value of the first intensity profile is indicated.

FIG. 9 shows energy at which the maximum value of the first intensity profile is indicated in the case where the location of X ray emitter 5 is changed within first main surface 11. The vertical axis of FIG. 9 represents energy at which the maximum value of the first intensity profile is indicated between the first energy and the second energy. The horizontal axis of FIG. 9 represents the location of X ray emitter 5. While changing the location of X ray emitter 5 at an interval of 5° in the range of 180°±15°, the energy at which the maximum value of the first intensity profile of the diffracted X ray in the range of 6.9 keV to 11.7 keV is indicated is measured.

As shown in FIG. 9, when the location of X ray emitter 5 is changed, the energy at which the maximum intensity is indicated is changed. When X ray emitter 5 is changed at an interval of 5° in the range of ±15° relative to the [−1-120] direction (i.e., 180°), maximum value EH1 and minimum value EL1 of the energy at which the maximum value of the first intensity profile is indicated are determined. When X ray emitter 5 is changed in the range of ±15° relative to the

[−1-120] direction, an absolute value of a difference between maximum value EH1 and minimum value EL1 of the energy at which first intensity profile 1 indicates the maximum value in the range of 6.9 keV to 11.7 keV is, for example, less than or equal to 0.06 keV, is preferably less than or equal to 0.05 keV, and is more preferably less than or equal to 0.04 keV. As the three-dimensional strain of the silicon carbide single crystal is smaller, the absolute value of a difference 111 between maximum value EH1 and minimum value EL1 of the energy at which first intensity profile 1 indicates the maximum value is smaller.

Next, the following describes a method for measuring a specific high index crystal plane indicated by the above-described crystal plane (1). In other words, the above-described specific high index crystal plane is a plane inclined by 66° in the direction of the (0001) plane relative to the (1-100) plane.

Figure 10:
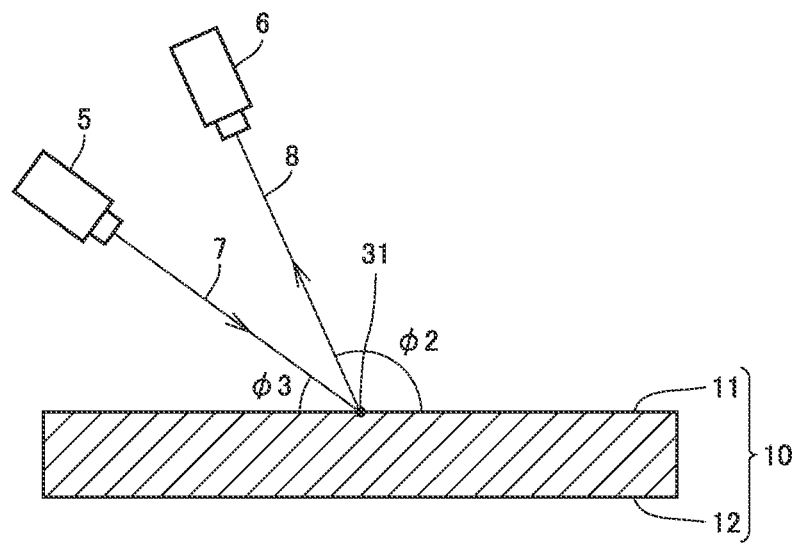
FIG. 10 is a schematic front view showing a method for measuring a second intensity profile.
Figure 11:
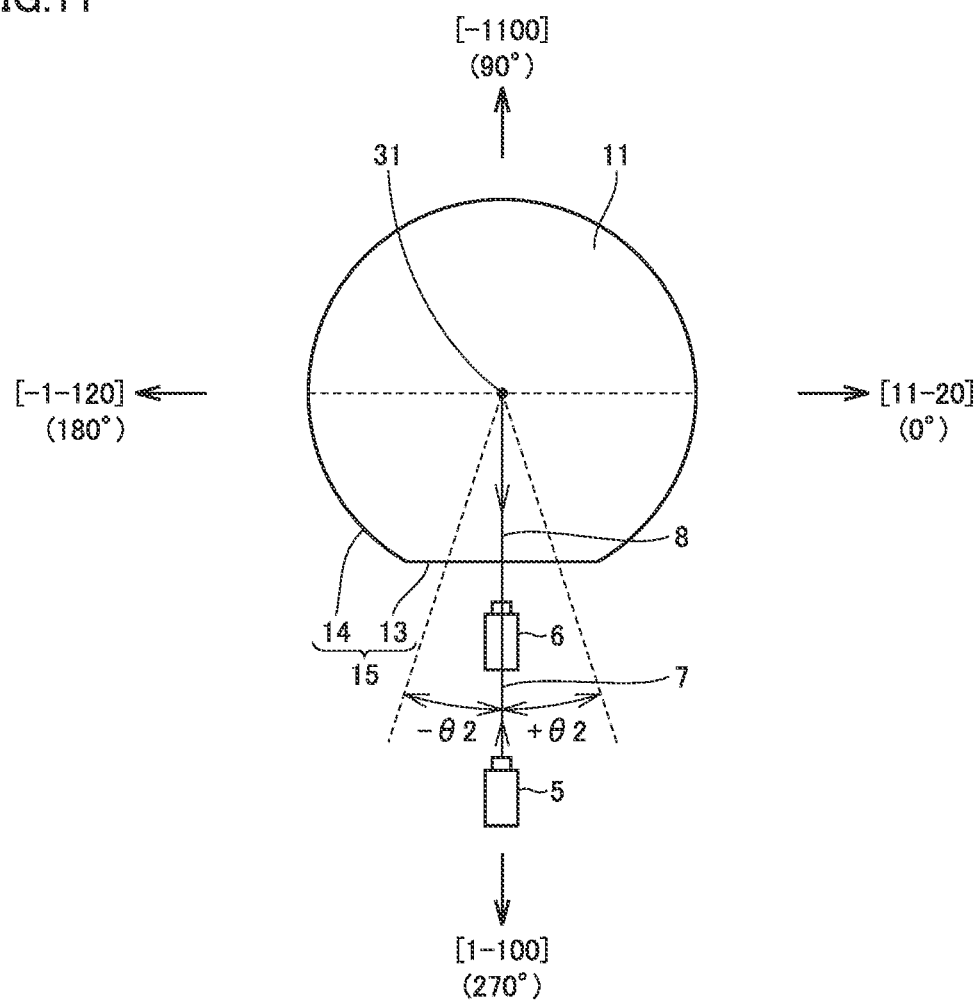
FIG. 11 is a schematic plan view showing the method for measuring the second intensity profile.

As shown in FIG. 10, X ray emitter 5 and detector 6 are positioned to face first main surface 11. As shown in FIG. 11, when viewed from center O of first main surface 11, X ray emitter 5 is positioned in the [1-100] direction. In other words, when viewed in the direction perpendicular to first main surface 11, X ray emitter 5 is positioned at the location of 270°. First measurement region 31 is irradiated with incoming X ray 7 from X ray emitter 5. When viewed from center O of first main surface 11, detector 6 is positioned in a direction parallel to the [−1100] direction. In other words, when viewed in the direction perpendicular to first main surface 11, detector 6 is positioned at the location of 90° or 270°. Diffracted X ray 8 diffracted by first measurement region 31 is measured by detector 6.

In the case where first main surface 11 corresponds to a plane angled off by 4° in the <11-20> direction relative to the (0001) plane, elevation angle φ3 of X ray emitter 5 relative to first main surface 11 (in other words, angle φ3 between incoming X ray 7 and first main surface 11: see FIG. 10) is 29.907°, for example. Elevation angle φ2 of detector 6 relative to first main surface 11 (in other words, angle φ2 between diffracted X ray 8 and first main surface 11: see FIG. 10) is 101.810°, for example. Elevation angle φ2 is an angle when viewed from the [−1100] direction side. In the case where elevation angle φ2 is more than 90°, detector 6 is located at a side opposite to the [−1100] direction when viewed from center O. That is, detector 6 is positioned at the location of 270°.

In the case where first main surface 11 corresponds to a plane angled off by 8° in the <11-20> direction relative to the (0001) plane, elevation angle φ3 of X ray emitter 5 relative to first main surface 11 (in other words, angle φ3 between incoming X ray 7 and first main surface 11: see FIG. 10) is 29.91°, for example. Elevation angle φ2 of detector 6 relative to first main surface 11 (in other words, angle φ2 between diffracted X ray 8 and first main surface 11: see FIG. 10) is 103.939°, for example. Since elevation angle φ2 is more than 90°, detector 6 is positioned at the location of 270°.

Figure 12:
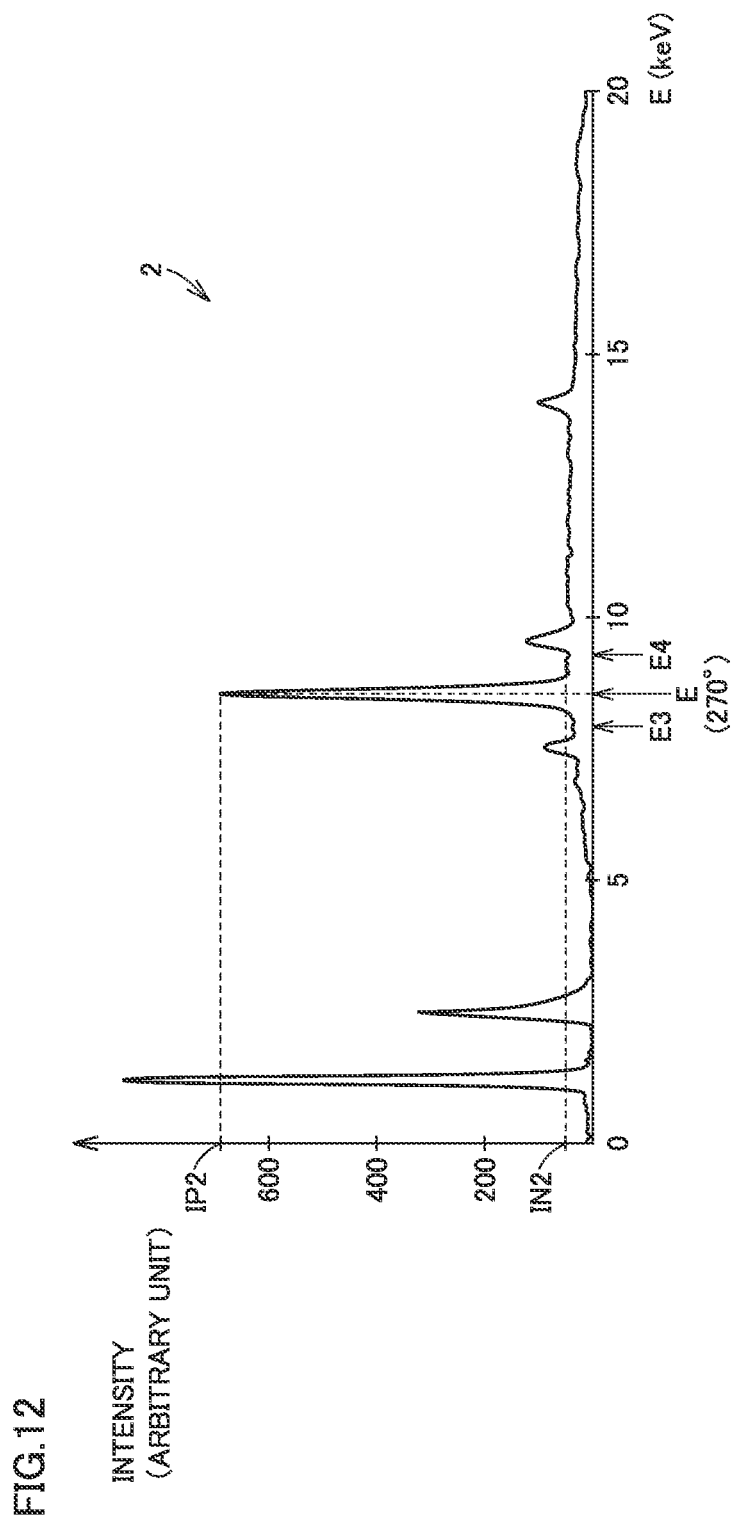
FIG. 12 shows an exemplary second intensity profile.

FIG. 12 shows an exemplary intensity profile (second intensity profile) of the diffracted X ray measured with X ray emitter 5 and detector 6 being positioned as shown in FIG. 11. The horizontal axis represents energy of the diffracted X ray. The vertical axis represents intensity of the diffracted X ray. As shown in FIG. 12, second intensity profile 2 has a maximum value at energy between third energy E3 and fourth energy E4. Third energy E3 is 8.0 keV, for example. Fourth energy E4 is 9.5 keV, for example. Fourth energy E4 may be 9.3 keV. The maximum value of second intensity profile 2 in the region between third energy E3 and fourth energy E4 results from the crystal plane indicated by the above-described crystal plane (1). When the off angle of first main surface 11 is changed, the energy at which the maximum value of the intensity profile is indicated is changed. For example, in the case where first main surface 11 corresponds to a plane angled off by 4° in the <11-20> direction relative to the (0001) plane, energy corresponding to the crystal plane indicated by the above-described crystal plane (1) is 8.48 keV, whereas in the case where first main surface 11 corresponds to a plane angled off by 8° in the <11-20> direction relative to the (0001) plane, energy corresponding to the crystal plane indicated by the above-described crystal plane (1) is 8.36 keV.

Based on second intensity profile 2, a maximum intensity IP2 of the intensity profile in the region between third energy E3 and fourth energy E4 and a background intensity IN2 thereof are measured. Background intensity IN2 is an intensity of the intensity profile at fourth energy E4, for example. Similarly, between third energy E3 and fourth energy E4, energy E(270°) at which second intensity profile 2 indicates the maximum value is measured.

Figure 13:
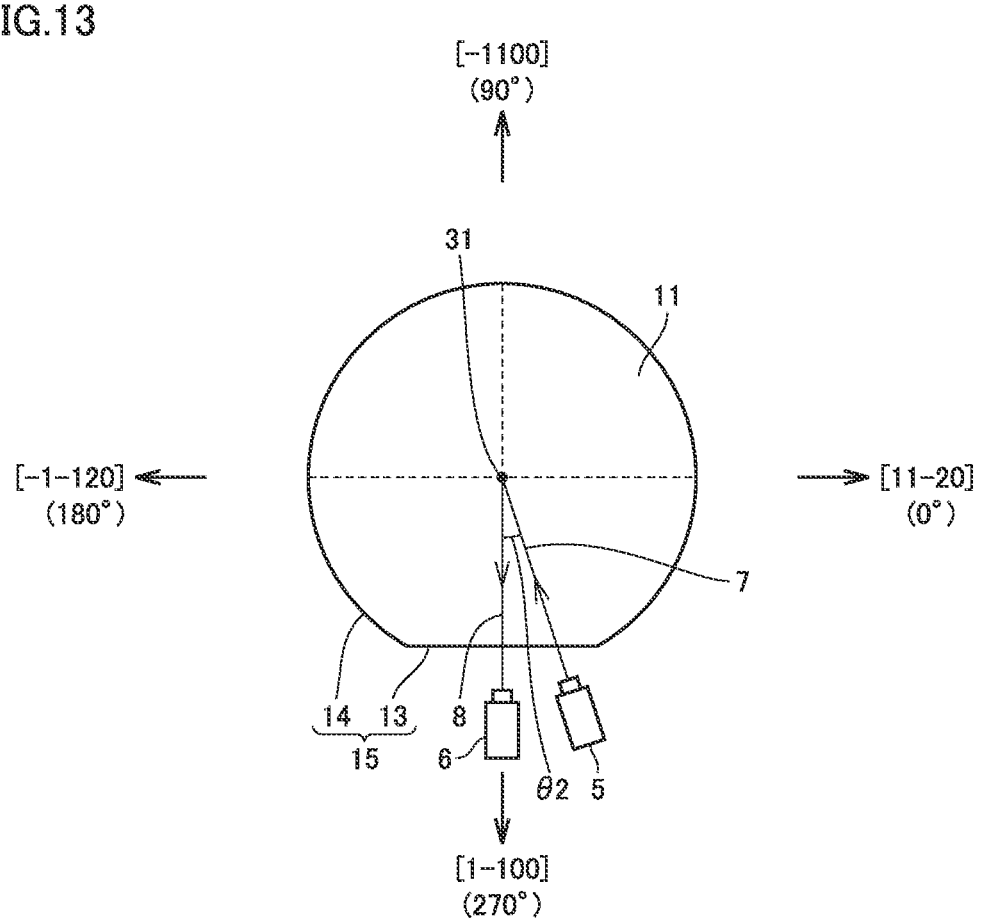
FIG. 13 is a schematic plan view showing the method for measuring the second intensity profile.

Next, the location of X ray emitter 5 is changed in the plane parallel to first main surface 11. As shown in FIG. 13, when viewed in the direction perpendicular to first main surface 11, X ray emitter 5 is positioned at a location of (270±θ2)°. Angle θ2 is 6°, for example. That is, when viewed in the direction perpendicular to first main surface 11, X ray emitter 5 is positioned at a location of 276°. Elevation angle φ3 (see FIG. 3) of X ray emitter 5 relative to first main surface 11 is the same as that in the case where X ray emitter 5 is positioned at the location of 270°. Detector 6 is positioned in the same manner as that in the case where X ray emitter 5 is positioned at the location of 270°. With the positioning above, first measurement region 31 is irradiated with incoming X ray 7 from X ray emitter 5 and diffracted X ray 8 diffracted by first measurement region 31 is measured by detector 6.

Accordingly, the second intensity profile of the diffracted X ray in the case where X ray emitter 5 is positioned at the location of 276° is obtained. Based on the second intensity profile, maximum intensity IP2 of the intensity profile in the region between third energy E3 and fourth energy E4 and background intensity IN2 thereof are measured. Similarly, energy E(276°) at which second intensity profile 2 indicates a maximum value is measured.

Figure 14:
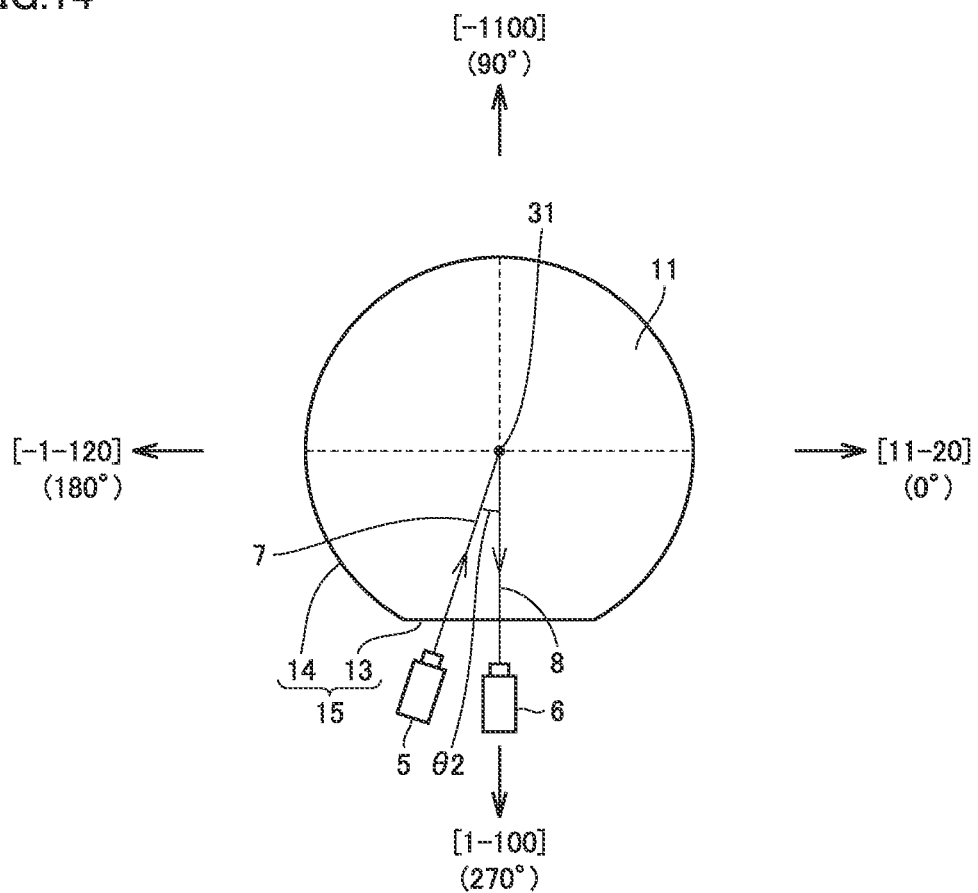
FIG. 14 is a schematic plan view showing the method for measuring the second intensity profile.

Next, the location of X ray emitter 5 is changed in the plane parallel to first main surface 11. As shown in FIG. 14, when viewed in the direction perpendicular to first main surface 11, X ray emitter 5 is positioned at a location of (270−θ2)°. Angle θ2 is 6°, for example. That is, when viewed in the direction perpendicular to first main surface 11, X ray emitter 5 is positioned at a location of 264°. Elevation angle φ3 (see FIG. 3) of X ray emitter 5 relative to first main surface 11 is the same as that in the case where X ray emitter 5 is positioned at the location of 270°. Detector 6 is positioned in the same manner as that in the case where X ray emitter 5 is positioned at the location of 270°. With the positioning above, first measurement region 31 is irradiated with incoming X ray 7 from X ray emitter 5 and diffracted X ray 8 diffracted by first measurement region 31 is measured by detector 6.

Accordingly, the second intensity profile of the diffracted X ray in the case where X ray emitter 5 is positioned at the location of 264° is obtained. Based on the second intensity profile, maximum intensity IP2 of the intensity profile in the region between third energy E3 and fourth energy E4 and background intensity IN2 thereof are measured. Similarly, energy E(264°) at which second intensity profile 2 indicates the maximum value is measured.

Figure 15:
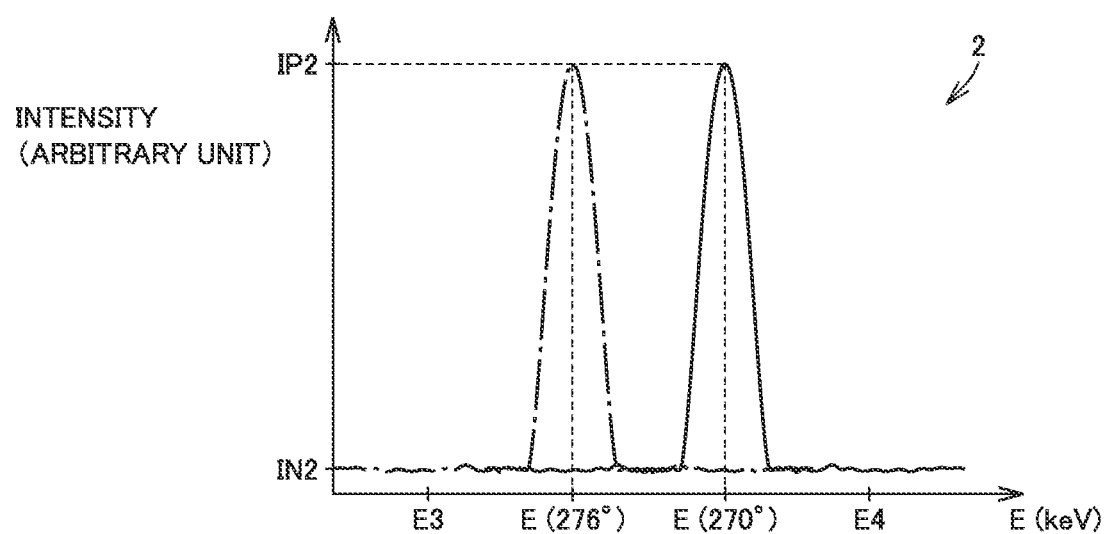
FIG. 15 shows an exemplary second intensity profile.

As shown in FIG. 15, energy E(276°) at which second intensity profile 2 indicates the maximum value in the case where X ray emitter 5 is positioned at the location of 276° may be different from energy E(270°) at which second intensity profile 2 indicates the maximum value in the case where X ray emitter 5 is positioned at the location of 270°. For example, when an arrangement of the crystal lattice of the silicon carbide when viewed in the direction of 276° is different from an arrangement of the crystal lattice of the silicon carbide when viewed in the direction of 270°, energy E(276°) at which second intensity profile 2 indicates the maximum value is different from energy E(270°) at which first intensity profile 1 indicates the maximum value. In other words, as the three-dimensional strain of the silicon carbide single crystal is smaller, a difference is smaller between energy E(276°) at which second intensity profile 2 indicates the maximum value and energy E(270°) at which second intensity profile 2 indicates the maximum value.

As described above, by changing the location of X ray emitter 5 at an interval of 2° in the range of 270°±6°, seven second intensity profiles are measured. Based on each of the seven second intensity profiles, maximum intensity IP2 of the second intensity profile in the region between third energy E3 and fourth energy E4 and background intensity IN2 thereof are measured. In each of all the second intensity profiles, a ratio (i.e., IP2/IN2) of the maximum intensity of second intensity profile 2 in the range of 8.0 keV to 9.5 keV to the background intensity of second intensity profile 2 is, for example, more than or equal to 1500, is preferably more than or equal to 2000, and is more preferably more than or equal to 2500.

In other words, in the case where detector 6 is positioned in the direction parallel to the [−1100] direction when viewed in the direction perpendicular to first main surface 11, where first measurement region 31 is irradiated with an X ray in the direction within ±6° relative to the [1-100] direction, and where a diffracted X ray from first measurement region 31 is measured using detector 6, the ratio of the maximum intensity of second intensity profile 2 of the diffracted X ray in the range of 8.0 keV to 9.5 keV to the background intensity of second intensity profile 2 is more than or equal to 1500.

Figure 16:
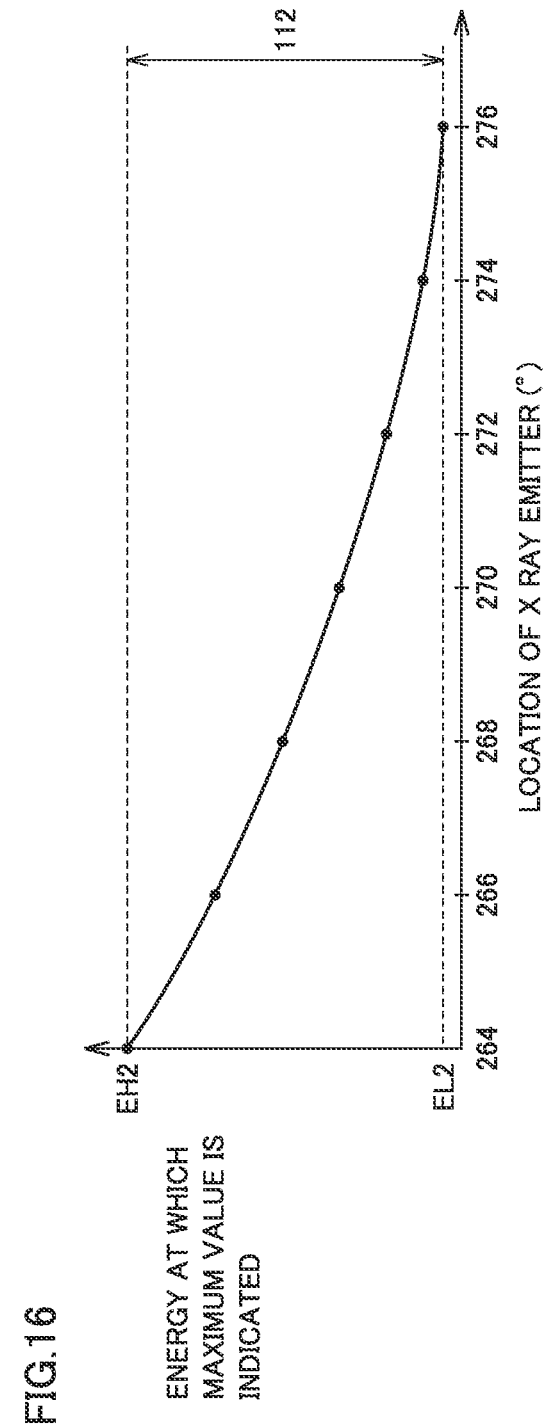
FIG. 16 shows a relation between an angle of the detector and energy at which the maximum value of the second intensity profile is indicated.

FIG. 16 shows energy at which the maximum value of the second intensity profile is indicated in the case where the location of X ray emitter 5 is changed within first main surface 11. The vertical axis of FIG. 16 represents energy at which the maximum value of the second intensity profile is indicated between the third energy and the fourth energy. The horizontal axis of FIG. 16 represents the location of X ray emitter 5. While changing the location of X ray emitter 5 at an interval of 2° in the range of 270°±6°, the energy at which the maximum value of the second intensity profile is indicated is measured.

As shown in FIG. 16, when the location of X ray emitter 5 is changed, the energy at which the maximum intensity is indicated is changed. When X ray emitter 5 is changed at an interval of 2° in the range of ±6° relative to the [1-100] direction (i.e., 270°), maximum value EH2 and minimum value EL2 of the energy at which the maximum value of the second intensity profile is indicated are determined. When X ray emitter 5 is changed in the range of ±6° relative to the [1-100] direction, an absolute value of a difference 112 between maximum value EH2 and minimum value EL2 of the energy at which second intensity profile 2 indicates the maximum value in the range of 8.0 keV to 9.5 keV is, for example, less than or equal to 0.08 keV, is preferably less than or equal to 0.07 keV, and is more preferably less than or equal to 0.06 keV. As the three-dimensional strain of the silicon carbide single crystal is smaller, the absolute value of difference 112 between maximum value EH2 and minimum value EL2 of the energy at which second intensity profile 2 indicates the maximum value is smaller.

Next, an intensity profile of diffracted X ray from a second measurement region 32 may be measured. Second measurement region 32 includes a location distant away by 10 mm from outer edge 15 of first main surface 11. The intensity profile of the diffracted X ray from second measurement region 32 is measured by the same method as the method for measuring the intensity profile of the diffracted X ray from first measurement region 31.

Figure 17:
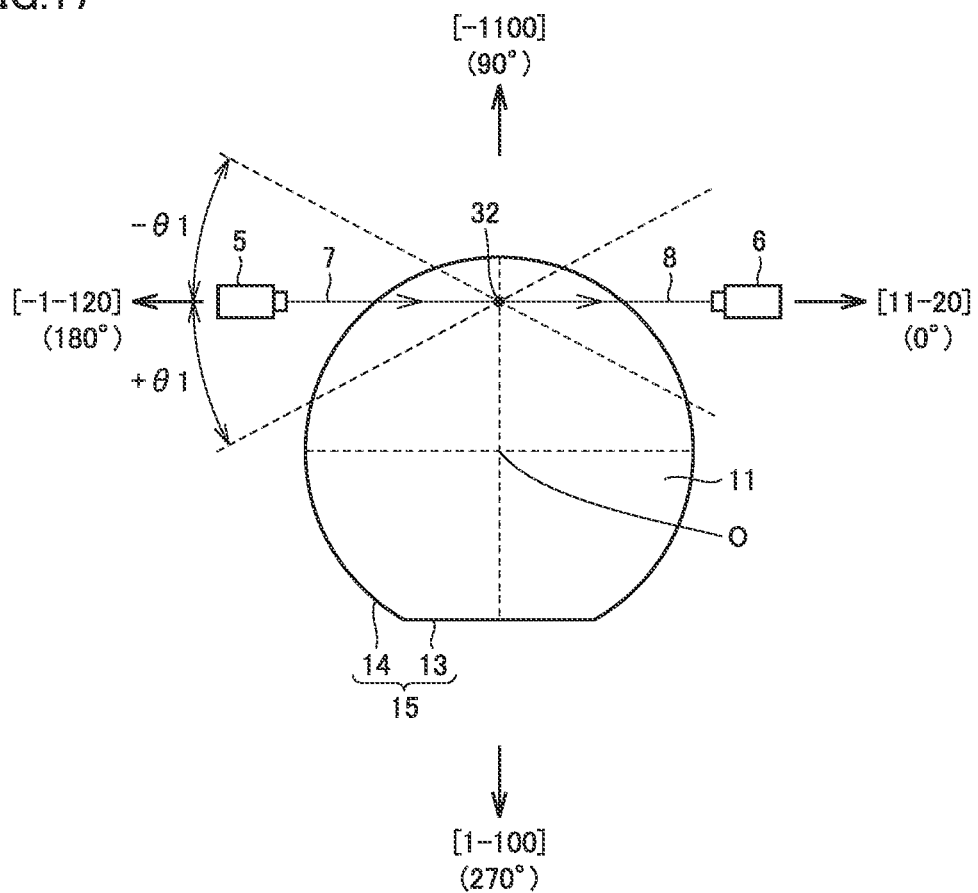
FIG. 17 is a schematic plan view showing a method for measuring a third intensity profile.

As shown in FIG. 17, detector 6 is positioned in the [11-20] direction when viewed in the direction perpendicular to first main surface 11, second measurement region 32 including the location distant away by 10 mm from outer edge 15 of main surface 11 is irradiated with an X ray in the direction within ±15° relative to the [−1-120] direction, and a diffracted X ray from second measurement region 32 is measured using detector 6. Accordingly, an intensity profile (third intensity profile 3) of the diffracted X ray is obtained (see FIG. 18).

Figure 18:
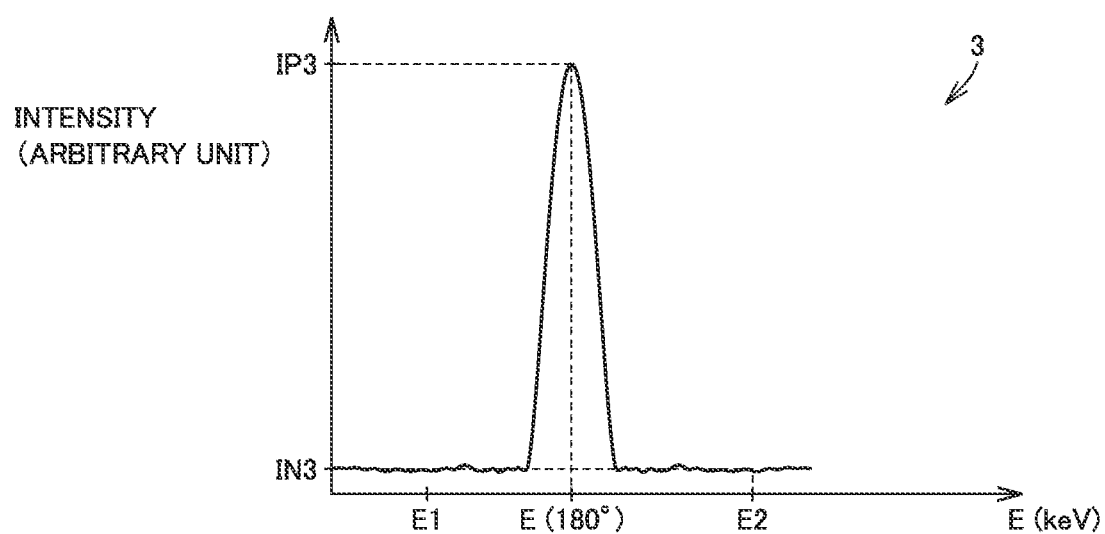
FIG. 18 shows an exemplary third intensity profile.

As shown in FIG. 18, a ratio (i.e., IP3/IN3) of maximum intensity IP3 of third intensity profile 3 of the diffracted X ray in the range of first energy E1 to second energy E2 to background intensity IN3 of third intensity profile 3 is, for example, more than or equal to 1500, is preferably more than or equal to 2000, and is more preferably more than or equal to 2500. First energy E1 is 6.9 keV, for example. Second energy E2 is 11.7 keV, for example. First energy E1 may be 7.7 keV. Second energy E2 may be 10.4 keV. The maximum value of third intensity profile 3 in the region between first energy E1 and second energy E2 results from the (0008) plane.

Figure 19:
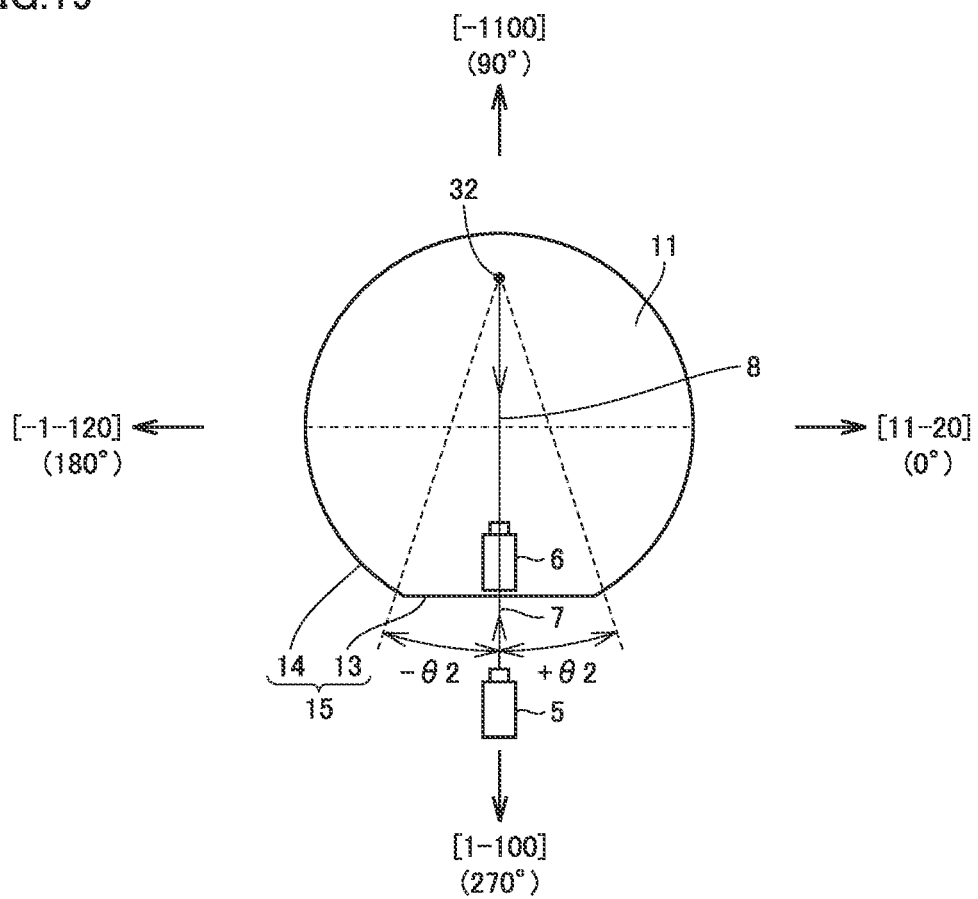
FIG. 19 is a schematic plan view showing a method for measuring a fourth intensity profile.

As shown in FIG. 19, detector 6 is positioned in the direction parallel to the [−1100] direction when viewed in the direction perpendicular to first main surface 11, second measurement region 32 is irradiated with an X ray in the direction within ±6° relative to the [1-100] direction, and a diffracted X ray from second measurement region 32 is measured using detector 6. Accordingly, an intensity profile (fourth intensity profile 4) of the diffracted X ray is obtained (see FIG. 20).

Figure 20:
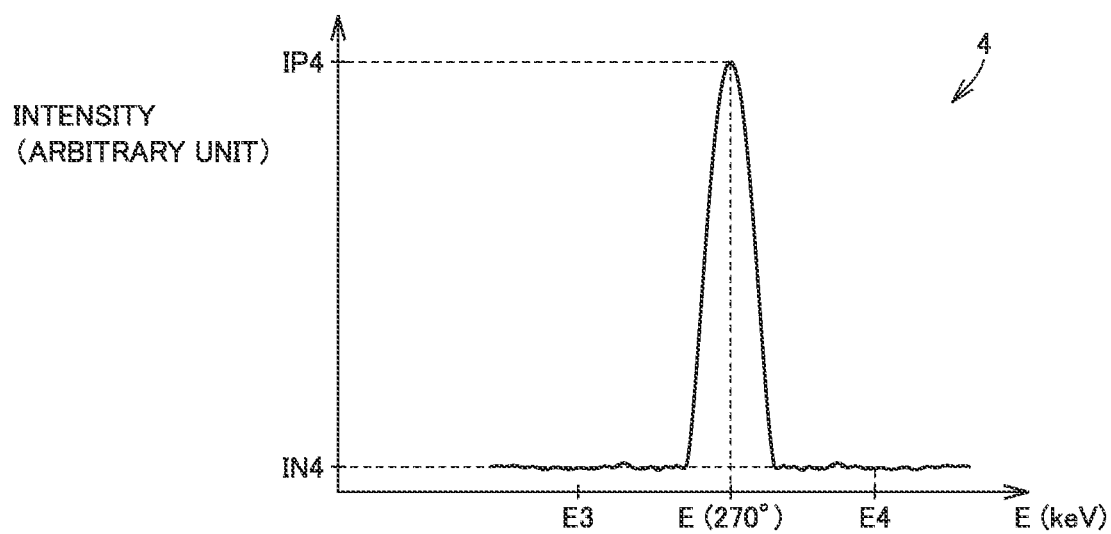
FIG. 20 shows an exemplary fourth intensity profile.

As shown in FIG. 20, a ratio (i.e., IP4/IN4) of maximum intensity IP4 of fourth intensity profile 4 of the diffracted X ray in the range of third energy E3 to fourth energy E4 to background intensity IN4 of fourth intensity profile 4 is, for example, more than or equal to 1500, is preferably more than or equal to 2000, and is more preferably more than or equal to 2500. Third energy E3 is 8.0 keV, for example. Fourth energy E4 is 9.5 keV, for example. Fourth energy E4 may be 9.3 keV. The maximum value of fourth intensity profile 4 in the region between third energy E3 and fourth energy E4 results from the crystal plane indicated by the above-described crystal plane (1).

In the case where detector 6 is positioned in the [11-20] direction when viewed in the direction perpendicular to first main surface 11 and the location to be irradiated with the X ray is changed in the range of ±15° relative to the [−1-120] direction, the absolute value of a difference 111 between the maximum value and minimum value of the energy at which third intensity profile 3 indicates the maximum value in the range of 6.9 keV to 11.7 keV is, for example, less than or equal to 0.06 keV, is preferably less than or equal to 0.05 keV, and is more preferably less than or equal to 0.04 keV (see FIG. 9).

In the case where detector 6 is positioned in the direction parallel to the [−1100] direction when viewed in the direction perpendicular to main surface 11 and the location to be irradiated with the X ray is changed in the range of ±6° relative to the [1-100] direction, the absolute value of a difference 112 between the maximum value and minimum value of the energy at which fourth intensity profile 4 indicates the maximum value in the range of 8.0 keV to 9.5 keV is, for example, less than or equal to 0.08 keV, is preferably less than or equal to 0.07 keV, and is more preferably less than or equal to 0.06 keV (see FIG. 16).

Next, the following describes a configuration of a manufacturing apparatus for a silicon carbide single crystal ingot.

Figure 21:
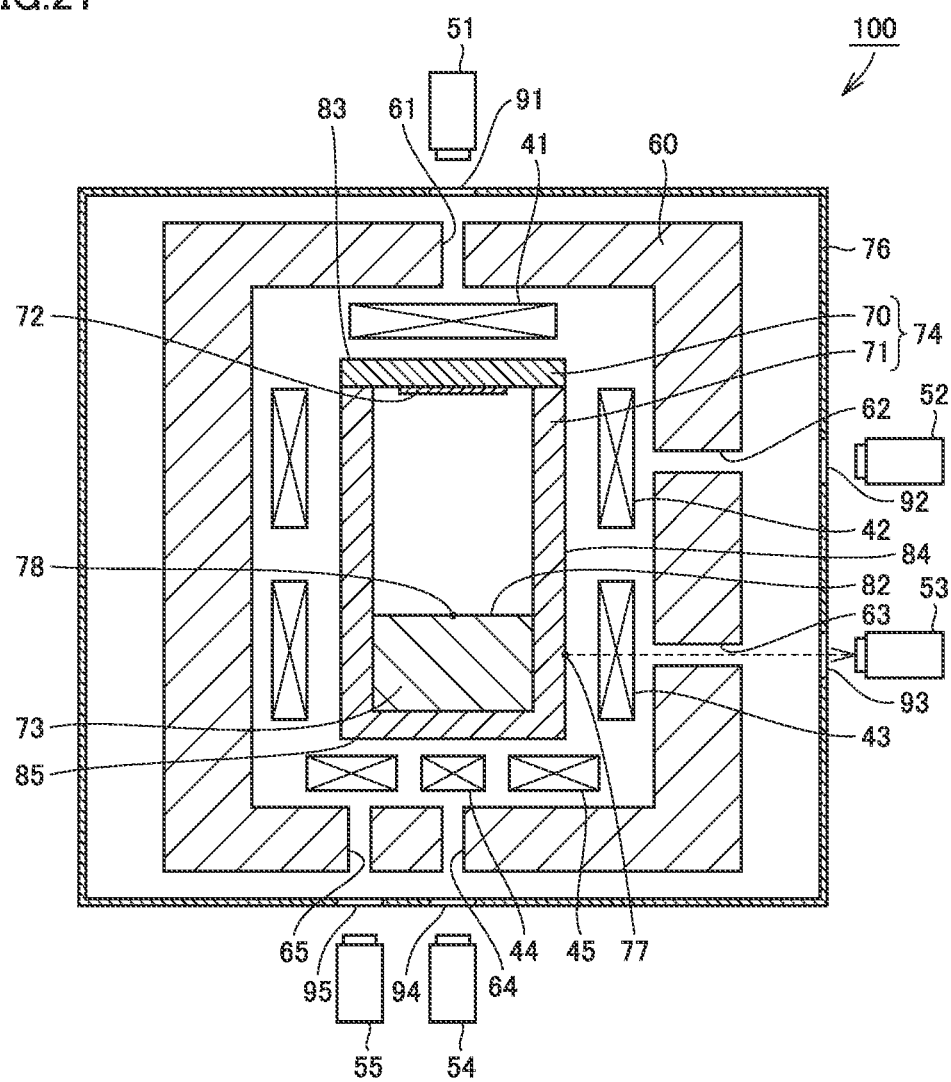
FIG. 21 is a schematic cross sectional view showing a configuration of a manufacturing apparatus for a silicon carbide single crystal ingot.

As shown in FIG. 21, a manufacturing apparatus 100 for a silicon carbide single crystal ingot mainly includes a crucible 74, a heat insulator 60, a furnace body 76, a first heater 41, a second heater 42, a third heater 43, a fourth heater 44, a fifth heater 45, a first radiation thermometer 51, a second radiation thermometer 52, a third radiation thermometer 53, a fourth radiation thermometer 54, and a fifth radiation thermometer 55. Crucible 74 has a seed crystal holding portion 70 and a source material accommodating portion 71. First heater 41, second heater 42, third heater 43, fourth heater 44, and fifth heater 45 are disposed inside heat insulator 60. Heat insulator 60 is disposed inside furnace body 76. First radiation thermometer 51, second radiation thermometer 52, third radiation thermometer 53, fourth radiation thermometer 54, and fifth radiation thermometer 55 are disposed outside furnace body 76.

Heat insulator 60 is provided with a first through hole 61, a second through hole 62, a third through hole 63, a fourth through hole 64, and a fifth through hole 65. First radiation thermometer 51 is disposed at a location facing a top surface 83 of crucible 74, and is configured to measure a temperature near the center of top surface 83 via a first window 91. Second radiation thermometer 52 is disposed at a location facing an upper portion of a side surface 84 of crucible 74, and is configured to measure a temperature at the upper portion of side surface 84 via a second window 92. Third radiation thermometer 53 is disposed at a location facing a lower portion of side surface 84 of crucible 74, and is configured to measure a temperature at the lower portion of side surface 84 via a third window 93. Fourth radiation thermometer 54 is disposed at a location facing a bottom surface 85 of crucible 74, and is configured to measure a temperature near the center of bottom surface 85 via a fourth window 94. Fifth radiation thermometer 55 is disposed at a location facing bottom surface 85 of crucible 74, and is configured to measure a temperature external to bottom surface 85 via a fifth window 95.

A control point 77 measured by third radiation thermometer 53 is a portion of side surface 84 of crucible 74, for example. The temperature of control point 77 is measured by third radiation thermometer 53, and third heater 43 is subjected to feedback control. Control point 77 may be other than crucible 74. Control point 77 may be a portion of a heater, for example. Similarly, for each of the other heaters, the temperature of a control point is measured by a corresponding radiation thermometer and is fed back to the heater. The same number of control points as the number of the heaters may be provided, and the heaters may be individually subjected to feedback control in accordance with the corresponding control points. The heaters may be controlled by way of master-slave control, in which a master heater is determined and part of the heaters provide outputs at certain ratios with respect to the output of the master heater. A plurality of master heaters may be provided in the master-slave control. In the axis of time, the feedback control and the master-slave control may be combined.

Source material accommodating portion 71 is configured to accommodate a silicon carbide source material 73. Seed crystal holding portion 70 is configured to hold a seed crystal 72 constituted of a silicon carbide single crystal. Each of first to fifth heaters 41 to 45 is a resistive heating type heater, for example. Each of first to fifth heaters 41 to 45 may be a high-frequency induction heating type coil, for example.

Next, the following describes a method for manufacturing a silicon carbide single crystal substrate.

As shown in FIG. 21, silicon carbide source material 73 is provided in source material accommodating portion 71. Silicon carbide source material 73 is polycrystal silicon carbide powder, for example. Seed crystal 72 is fixed to seed crystal holding portion 70 using an adhesive agent, for example. Seed crystal 72 is constituted of a hexagonal silicon carbide single crystal of polytype 4H, for example. The diameter of the surface of seed crystal 72 is, for example, more than or equal to 100 mm and is preferably more than or equal to 150 mm. The surface of seed crystal 72 corresponds to a plane inclined by more than or equal to 0.5° and less than or equal to 8° relative to the (0001) plane, for example. Seed crystal 72 is disposed to face surface 82 of silicon carbide source material 73. As described above, seed crystal 72 and silicon carbide source material 73 are disposed in crucible 74.

Figure 22:
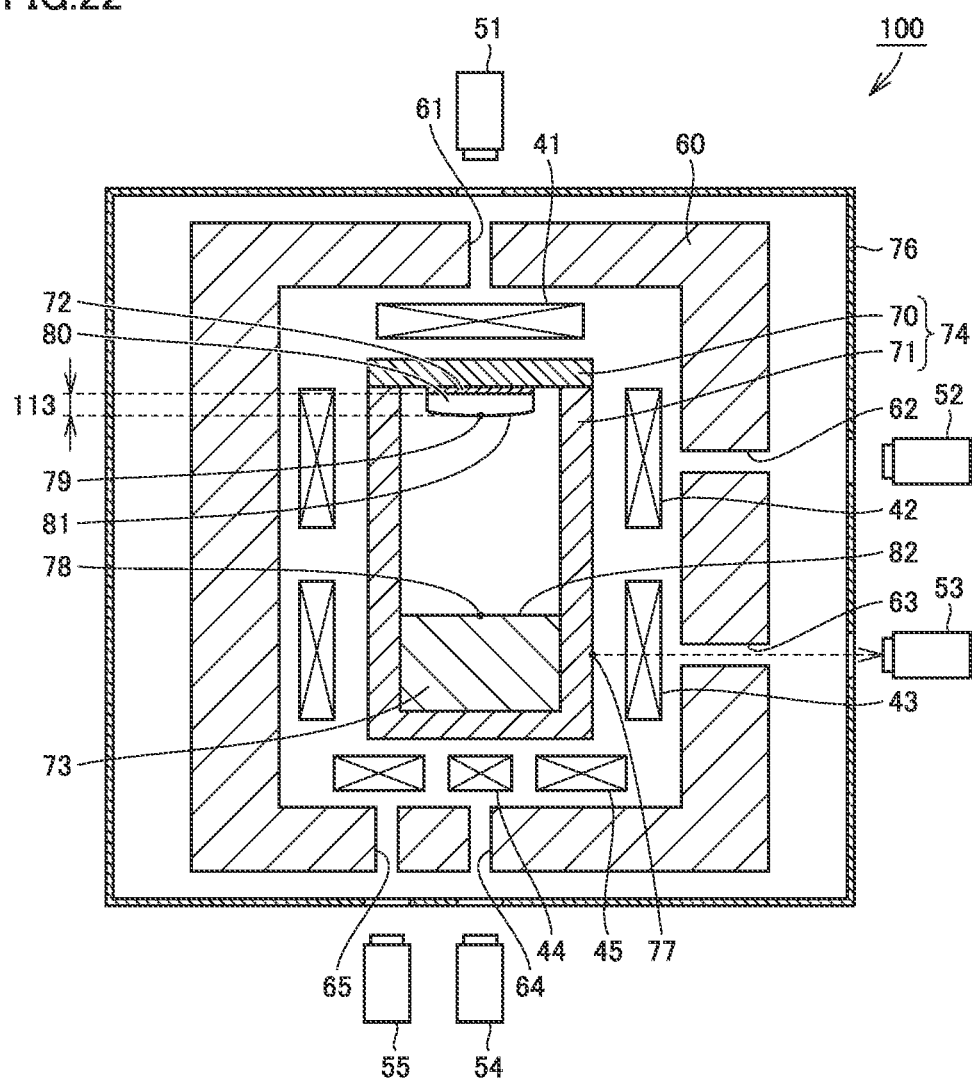
FIG. 22 is a schematic cross sectional view showing a method for manufacturing the silicon carbide single crystal substrate.

Next, crucible 74 is heated up to a temperature of about more than or equal to 2000° C. and less than or equal to 2400° C., for example. While increasing the temperature of crucible 74, the pressure of an atmospheric gas in furnace body 76 is maintained at about 80 kPa, for example. The atmospheric gas includes an inert gas, such as argon gas, helium gas, or nitrogen gas, for example. Next, the pressure of the atmospheric gas in furnace body 76 is decreased to 1.7 kPa, for example. Accordingly, silicon carbide source material 73 starts to be sublimated, and is recrystallized on the surface of seed crystal 72 disposed at the location facing the surface of silicon carbide source material 73. As a result, a silicon carbide single crystal starts to grow on the surface of seed crystal 72. During the growth of the silicon carbide single crystal, the pressure in furnace body 76 is maintained at, for example, about more than or equal to 0.5 kPa and less than or equal to 5 kPa for about 100 hours. By sublimating silicon carbide source material 73 as described above, silicon carbide single crystal 80 (see FIG. 22) grows on seed crystal 72.

In the step of growing the silicon carbide single crystal, the temperature of surface 81 (see FIG. 22) of silicon carbide single crystal 80 is maintained to be lower than the temperature of surface 82 (see FIG. 22) of silicon carbide source material 73. Specifically, in a direction from silicon carbide source material 73 toward seed crystal 72, a temperature gradient is provided such that the temperature of surface 81 of silicon carbide single crystal 80 becomes lower than the temperature of surface 82 of silicon carbide source material 73.

As described above, in order to obtain a high-quality silicon carbide single crystal with small strain, it is desirable that the growth of silicon carbide single crystal 80 proceeds with a small change in thermal environment of the crystal surface in the process of growing the silicon carbide single crystal, while maintaining growth surface 81 of silicon carbide single crystal 80 as flat as possible. Specifically, in the step of growing the silicon carbide single crystal, a temperature distribution of growth surface 81 of silicon carbide single crystal 80 (i.e., a difference between the maximum and minimum temperatures in growth surface 81) is maintained to be always less than or equal to 5° C. In the step of growing the silicon carbide single crystal, a temperature of center 79 of growth surface 81 (i.e., a difference between the maximum and minimum temperatures of center 79 of growth surface 81 during a period of time from the start of the growth of silicon carbide single crystal 80 to the end of the growth of silicon carbide single crystal 80) is maintained to be always less than or equal to 3° C.

In the step of growing the silicon carbide single crystal, a temperature distribution of silicon carbide source material 73 (i.e., a difference between the maximum and minimum temperatures in the whole of the silicon carbide source material) is maintained to be always less than or equal to 20° C. In the step of growing the silicon carbide single crystal, a temperature of center 78 of surface 82 of silicon carbide source material 73 (i.e., a difference between the maximum and minimum temperatures of center 78 of surface 82 during the period of time from the start of the growth of silicon carbide single crystal 80 to the end of the growth of silicon carbide single crystal 80) is maintained to be always less than or equal to 5° C.

In the step of growing the silicon carbide single crystal, in order to realize the above-described conditions, the optimum values of heater powers of first to fifth heaters 41 to 45 are calculated through a thermal fluid simulation. Specifically, in a range in which the length of the silicon carbide single crystal is 0 to 25 mm, the thermal fluid simulation is performed for every 1 mm, thereby calculating the optimum values of the heater powers of first to fifth heaters 41 to 45.

Figure 23:
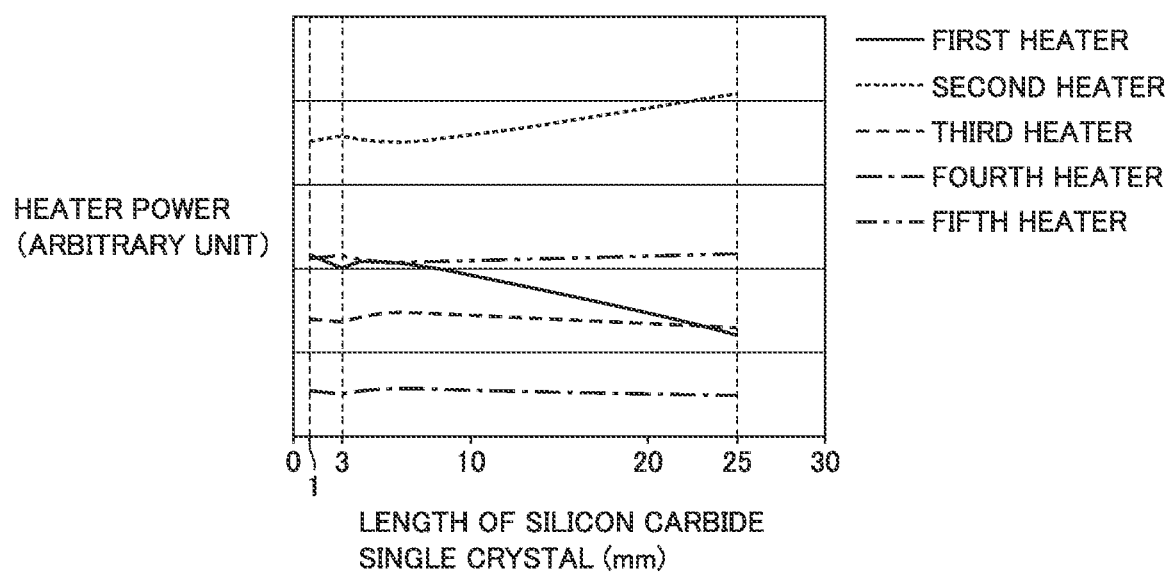
FIG. 23 shows a relation between a heater power and a length of a silicon carbide single crystal in a step of growing the silicon carbide single crystal.

Next, the following describes exemplary optimum values of the heater powers of the first to fifth heaters in the step of growing the silicon carbide single crystal. In FIG. 23, the vertical axis represents each of the heater powers of first to fifth heaters 41 to 45, whereas the horizontal axis represents length 113 (see FIG. 22) of silicon carbide single crystal 80 grown on seed crystal 72. In other words, the horizontal axis corresponds to growth time.

As shown in FIG. 23, when the length of the silicon carbide single crystal is 1 mm (immediately after the start of the growth of the silicon carbide single crystal), the heater power of second heater 42 is the maximum and the heater power of fourth heater 44 is the minimum among the five heaters. The heater powers of first heater 41 and fifth heater 45 are larger than the heater power of third heater 43. The heater power of first heater 41 is substantially the same as the heater power of fifth heater 45.

While the length of the silicon carbide single crystal is 1 mm to 3 mm, the heater power of second heater 42 is increased. The heater powers of first heater 41, third heater 43, and fourth heater 44 are decreased. After the length of the silicon carbide single crystal becomes about 3 mm, the heater powers of second heater 42 and fifth heater 45 are decreased. Then, the heater power of second heater 42 is increased. After the length of the silicon carbide single crystal becomes about 3 mm, the heater powers of first heater 41, third heater 43, and fourth heater 44 are temporarily increased. Then, the heater powers of first heater 41, third heater 43 and fourth heater 44 are decreased.

As shown in FIG. 23, when the length of the silicon carbide single crystal becomes about 3 mm as a result of the growth of the silicon carbide single crystal, the heater power of first heater 41 is temporarily increased, but is then gradually decreased. On the other hand, when the length of the silicon carbide single crystal becomes about 3 mm as a result of the growth of the silicon carbide single crystal, the heater power of second heater 42 is temporarily decreased, but is then gradually increased. When the length of silicon carbide single crystal is 25 mm (upon the end of the growth of the silicon carbide single crystal), the heater power of second heater 42 is the maximum and the heater power of fourth heater 44 is the minimum among the five heaters. The heater power of fifth heater 45 is larger than the heater power of third heater 43. The heater power of first heater 41 is smaller than the heater power of third heater 43.

After the end of the crystal growth of silicon carbide single crystal 80, silicon carbide single crystal 80 is cooled. After the temperature of silicon carbide single crystal 80 becomes about a room temperature, silicon carbide single crystal 80 is removed from manufacturing apparatus 100. Silicon carbide single crystal 80 is sliced using, for example, a wire saw, thereby obtaining silicon carbide single crystal substrate 10 (see FIG. 1).

In the above-described embodiment, it has been illustrated that the number of zones of the heaters that can be individually controlled in heater power is 5; however, the number of the zones is not limited to 5. For example, the number of the zones of the heaters may be 6, 7, or 8 by further dividing the top surface side heater, the side surface side heaters, and the bottom surface side heaters. By increasing the number of the zones of the heaters, the temperature of the silicon carbide single crystal can be controlled with precision. Accordingly, a silicon carbide single crystal substrate with further reduced strain can be obtained.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first intensity profile; 2: second intensity profile; 3: third intensity profile; 4: fourth intensity profile; 5: X ray emitter; 6: detector; 7: incoming X ray (X ray); 8: diffracted X ray; 10: silicon carbide single crystal substrate; 11: first main surface (main surface); 12: second main surface; 13: first flat; 14: curvature portion; 15: outer edge; 16: maximum diameter; 31: first measurement region; 32: second measurement region; 41: first heater; 42: second heater; 43: third heater; 44: fourth heater; 45: fifth heater; 51: first radiation thermometer; 52: second radiation thermometer; 53: third radiation thermometer; 54: fourth radiation thermometer; 55: fifth radiation thermometer; 60: heat insulator; 61: first through hole; 62: second through hole; 63: third through hole; 64: fourth through hole; 65: fifth through hole; 70: seed crystal holding portion; 71: source material accommodating portion; 72: seed crystal; 73: silicon carbide source material; 74: crucible; 76: furnace body; 77: control point; 78, 79, O: center; 80: silicon carbide single crystal; 81: growth surface (surface); 82: surface; 83: top surface; 84: side surface; 85: bottom surface; 91: first window; 92: second window; 93: third window; 94: fourth window; 95: fifth window; 100: manufacturing apparatus; 101: first direction (off direction); 102: second direction; 111, 112: difference; 113: length; E1: first energy; E2: second energy; E3: third energy; E4: fourth energy; EH1, EH2: maximum value; EL1, EL2: minimum value; IN1, IN2, IN3, IN4: background intensity; IP1, IP2, IP3, IP4: maximum intensity.

The invention claimed is:

1. A silicon carbide single crystal substrate comprising a main surface inclined in a <11-20> direction relative to a (0001) plane, wherein
when a detector is positioned in a [11-20] direction when viewed in a direction perpendicular to the main surface, when a first measurement region including a center of the main surface is irradiated with an X ray in a direction within ±15° relative to a [-1-120] direction, and when a diffracted X ray from the first measurement region is measured using the detector, a ratio of a maximum intensity of a first intensity profile of the diffracted X ray in a range of 6.9 keV to 11.7 keV to a background intensity of the first intensity profile is more than or equal to 1500.

2. The silicon carbide single crystal substrate according to claim 1, wherein
when the detector is positioned in a direction parallel to a [-1100] direction when viewed in the direction perpendicular to the main surface, when the first measurement region is irradiated with an X ray in a direction within ±6° relative to a [1-100] direction, and when a diffracted X ray from the first measurement region is measured using the detector, a ratio of a maximum intensity of a second intensity profile of the diffracted X ray in a range of 8.0 keV to 9.5 keV to a background intensity of the second intensity profile is more than or equal to 1500, and
when the detector is positioned in the direction parallel to the [-1100] direction when viewed in the direction perpendicular to the main surface and a location to be irradiated with the X ray is changed in a range of ±6° relative to the [1-100] direction, an absolute value of a difference between maximum value and minimum value of energy at which the second intensity profile indicates a maximum value in the range of 8.0 keV to 9.5 keV is less than or equal to 0.08 keV.

3. A silicon carbide single crystal substrate comprising a main surface inclined in a <11-20> direction relative to a (0001) plane, wherein
when a detector is positioned in a [11-20] direction when viewed in a direction perpendicular to the main surface, when a first measurement region including a center of the main surface is irradiated with an X ray while changing a location to be irradiated with the X ray in a range of ±15° relative to a [-1-120] direction, and when a diffracted X ray from the first measurement region is measured using the detector, an absolute value of a difference between maximum value and minimum value of energy at which a first intensity profile indicates a maximum value in a range of 6.9 keV to 11.7 keV is less than or equal to 0.06 keV.

4. The silicon carbide single crystal substrate according to claim 3, wherein
when the detector is positioned in a direction parallel to a [-1100] direction when viewed in the direction perpendicular to the main surface, when the first measurement region is irradiated with an X ray in a direction within ±6° relative to a [1-100] direction, and when a diffracted X ray from the first measurement region is measured using the detector, a ratio of a maximum intensity of a second intensity profile of the diffracted X ray in a range of 8.0 keV to 9.5 keV to a background intensity of the second intensity profile is more than or equal to 1500, and
when the detector is positioned in the direction parallel to the [-1100] direction when viewed in the direction perpendicular to the main surface and the location to be irradiated with the X ray is changed in a range of ±6° relative to the [1-100] direction, an absolute value of a difference between maximum value and minimum value of energy at which the second intensity profile indicates a maximum value in the range of 8.0 keV to 9.5 keV is less than or equal to 0.08 keV.

5. A silicon carbide single crystal substrate comprising a main surface inclined in a <11-20> direction relative to a (0001) plane, wherein
when a detector is positioned in a direction parallel to a [-1100] direction when viewed in a direction perpendicular to the main surface, when a first measurement region is irradiated with an X ray in a direction within ±6° relative to a [1-100] direction, and when a diffracted X ray from the first measurement region is measured using the detector, a ratio of a maximum intensity of a second intensity profile of the diffracted X ray in a range of 8.0 keV to 9.5 keV to a background intensity of the second intensity profile is more than or equal to 1500.

6. The silicon carbide single crystal substrate according to claim 5, wherein when the detector is positioned in the direction parallel to the [-1100] direction when viewed in the direction perpendicular to the main surface and a location to be irradiated with the X ray is changed in a range of ±6° relative to the [1-100] direction, an absolute value of a difference between maximum value and minimum value of energy at which the second intensity profile indicates a maximum value in the range of 8.0 keV to 9.5 keV is less than or equal to 0.08 keV.

7. A silicon carbide single crystal substrate comprising a main surface inclined in a <11-20> direction relative to a (0001) plane, wherein
when a detector is positioned in a direction parallel to a [-1100] direction when viewed in a direction perpendicular to the main surface, when a first measurement region is irradiated with an X ray while changing a location to be irradiated with the X ray in a range of ±6° relative to a [1-100] direction, and when a diffracted X ray from the first measurement region is measured using the detector, an absolute value of a difference between maximum value and minimum value of energy at which the second intensity profile indicates a maximum value in the range of 8.0 keV to 9.5 keV is less than or equal to 0.08 keV.

* * * * *